United States Patent
Shirayanagi

(10) Patent No.: US 6,554,426 B2
(45) Date of Patent: Apr. 29, 2003

(54) METHODS FOR DESIGNING AND MANUFACTURING SINGLE-VISION SPECTACLE LENS AND MANUFACTURING SYSTEM THEREOF

(75) Inventor: Moriyasu Shirayanagi, Saitama-ken (JP)

(73) Assignee: Pentax Corporation, Tokyo (JP)

( * ) Notice: Subject to any disclaimer, the term of this patent is extended or adjusted under 35 U.S.C. 154(b) by 161 days.

(21) Appl. No.: 09/851,384

(22) Filed: May 9, 2001

(65) Prior Publication Data

US 2001/0050752 A1 Dec. 13, 2001

(30) Foreign Application Priority Data

May 10, 2000 (JP) ........................................ 2000-137108

(51) Int. Cl.[7] ................................................ G02C 7/02
(52) U.S. Cl. ........................................ 351/177; 351/159
(58) Field of Search .................................. 351/159, 177

(56) References Cited

U.S. PATENT DOCUMENTS 5,220,359 A  6/1993  Roffman ..................... 351/177
5,825,454 A * 10/1998  Yamakaji et al. ........... 351/159
6,193,370 B1  2/2001  Shirayanagi ................. 351/177

FOREIGN PATENT DOCUMENTS

WO          99/23526        5/1999

* cited by examiner

Primary Examiner—Scott J. Sugarman
(74) Attorney, Agent, or Firm—Greenblum & Bernstein, P.L.C.

(57) ABSTRACT

A design method of a spectacle lens includes step for selecting one or more lens parameters as variables among a plurality of lens parameters, step for assigning values of the same optical aberration at different evaluation points on the lens to all of evaluation functions that evaluate optical aberration and step for optimizing the selected lens parameters by setting target values of the evaluation functions to zero. The optimizing step includes repetition of step for calculating the magnitude of the evaluation function at each evaluation point on the lens and step for adjusting the values of the selected lens parameters such that the evaluation functions are closer to zero.

12 Claims, 27 Drawing Sheets

FIG. 3

| No. | PARAMETER | VALUE | VARIABLE |
|---|---|---|---|
| 1 | N | 1.600 | |
| 2 | DIA | 70.000 | |
| 3 | R1 | 300.000 | |
| 4 | R2 * | 59.985 | V |
| 5 | CT | 1.000 | |
| 6 | K | 0.000 | |
| 7 | A04 | $-3.28710 \times 10^{-7}$ | V |
| 8 | A06 | $5.45858 \times 10^{-10}$ | V |
| 9 | A08 | $-6.29569 \times 10^{-13}$ | V |
| 10 | A10 | $5.13812 \times 10^{-16}$ | V |

FIG. 4

| No. | VE | OD | h | TV | WEIGHT |
|---|---|---|---|---|---|
| 1 | DAP | ∞ | 2.00 | 0.00 | 1.00 |
| 2 | DAP | ∞ | 4.00 | 0.00 | 1.00 |
| 3 | DAP | ∞ | 6.00 | 0.00 | 1.00 |
| 4 | DAP | ∞ | 8.00 | 0.00 | 1.00 |
| 5 | DAP | ∞ | 10.00 | 0.00 | 1.00 |
| 6 | DAP | ∞ | 12.00 | 0.00 | 0.95 |
| 7 | DAP | ∞ | 14.00 | 0.00 | 0.90 |
| 8 | DAP | ∞ | 16.00 | 0.00 | 0.85 |
| 9 | DAP | ∞ | 18.00 | 0.00 | 0.80 |
| 10 | DAP | ∞ | 20.00 | 0.00 | 0.75 |
| 11 | DAP | ∞ | 22.00 | 0.00 | 0.70 |
| 12 | DAP | ∞ | 24.00 | 0.00 | 0.65 |
| 13 | DAP | ∞ | 26.00 | 0.00 | 0.60 |
| 14 | DAP | ∞ | 28.00 | 0.00 | 0.55 |
| 15 | DAP | ∞ | 30.00 | 0.00 | 0.50 |
| 16 | DAP | ∞ | 32.00 | 0.00 | 0.45 |
| 17 | DAP | ∞ | 34.00 | 0.00 | 0.40 |
| 18 | DAP | ∞ | 36.00 | 0.00 | 0.35 |
| 19 | DAP | ∞ | 38.00 | 0.00 | 0.30 |
| 20 | DAP | ∞ | 40.00 | 0.00 | 0.25 |
| 21 | AP * | ∞ | 0.00 | -8.00 | 1.00 |

FIG. 7

| No. | PARAMETER | VALUE | VARIABLE |
|---|---|---|---|
| 1 | N | 1.600 | |
| 2 | DIA | 70.000 | |
| 3 | R1 * | 75.000 | |
| 4 | R2 | 262.695 | V |
| 5 | CT | 6.857 | V |
| 6 | K | 0.000 | |
| 7 | A04 | $-3.59083 \times 10^{-7}$ | V |
| 8 | A06 | $5.41306 \times 10^{-11}$ | V |
| 9 | A08 | $-1.39419 \times 10^{-14}$ | V |
| 10 | A10 | $7.92822 \times 10^{-19}$ | V |

FIG. 8

| No. | VE | OD | h | TV | WEIGHT |
|---|---|---|---|---|---|
| 1 | DAP | ∞ | 2.00 | 0.00 | 1.00 |
| 2 | DAP | ∞ | 4.00 | 0.00 | 1.00 |
| 3 | DAP | ∞ | 6.00 | 0.00 | 1.00 |
| 4 | DAP | ∞ | 8.00 | 0.00 | 1.00 |
| 5 | DAP | ∞ | 10.00 | 0.00 | 1.00 |
| 6 | DAP | ∞ | 12.00 | 0.00 | 0.95 |
| 7 | DAP | ∞ | 14.00 | 0.00 | 0.90 |
| 8 | DAP | ∞ | 16.00 | 0.00 | 0.85 |
| 9 | DAP | ∞ | 18.00 | 0.00 | 0.80 |
| 10 | DAP | ∞ | 20.00 | 0.00 | 0.75 |
| 11 | DAP | ∞ | 22.00 | 0.00 | 0.70 |
| 12 | DAP | ∞ | 24.00 | 0.00 | 0.65 |
| 13 | DAP | ∞ | 26.00 | 0.00 | 0.60 |
| 14 | DAP | ∞ | 28.00 | 0.00 | 0.55 |
| 15 | DAP | ∞ | 30.00 | 0.00 | 0.50 |
| 16 | DAP | ∞ | 32.00 | 0.00 | 0.45 |
| 17 | DAP | ∞ | 34.00 | 0.00 | 0.40 |
| 18 | DAP | ∞ | 36.00 | 0.00 | 0.35 |
| 19 | DAP | ∞ | 38.00 | 0.00 | 0.30 |
| 20 | DAP | ∞ | 40.00 | 0.00 | 0.25 |
| 21 | AP * | ∞ | 0.00 | 6.00 | 1.00 |
| 22 | T * | | 35.00 | 1.00 | 1.00 |

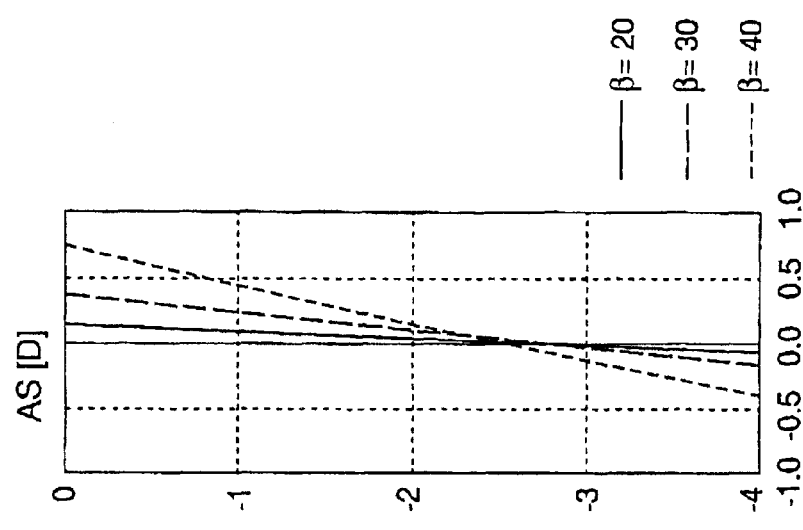

FIG. 11

| No. | PARAMETER | VALUE | VARIABLE |
|---|---|---|---|
| 1 | N | 1.600 | |
| 2 | DIA | 70.000 | |
| 3 | R1 | 300.000 | |
| 4 | R2 * | 99.958 | V |
| 5 | CT | 1.000 | |
| 6 | K | 0.000 | |
| 7 | A04 | $-4.63564 \times 10^{-7}$ | V |
| 8 | A06 | $2.12663 \times 10^{-10}$ | V |
| 9 | A08 | $-7.54803 \times 10^{-14}$ | V |
| 10 | A10 | $1.68619 \times 10^{-17}$ | V |

FIG. 12

| No. | VE | OD | h | TV | WEIGHT |
|---|---|---|---|---|---|
| 1 | DAP | 1000 | 2.00 | 0.00 | 1.00 |
| 2 | DAP | 1000 | 4.00 | 0.00 | 1.00 |
| 3 | DAP | 1000 | 6.00 | 0.00 | 1.00 |
| 4 | DAP | 1000 | 8.00 | 0.00 | 1.00 |
| 5 | DAP | 1000 | 10.00 | 0.00 | 1.00 |
| 6 | DAP | 1000 | 12.00 | 0.00 | 0.95 |
| 7 | DAP | 1000 | 14.00 | 0.00 | 0.90 |
| 8 | DAP | 1000 | 16.00 | 0.00 | 0.85 |
| 9 | DAP | 1000 | 18.00 | 0.00 | 0.80 |
| 10 | DAP | 1000 | 20.00 | 0.00 | 0.75 |
| 11 | DAP | 1000 | 22.00 | 0.00 | 0.70 |
| 12 | DAP | 1000 | 24.00 | 0.00 | 0.65 |
| 13 | DAP | 1000 | 26.00 | 0.00 | 0.60 |
| 14 | DAP | 1000 | 28.00 | 0.00 | 0.55 |
| 15 | DAP | 1000 | 30.00 | 0.00 | 0.50 |
| 16 | DAP | 1000 | 32.00 | 0.00 | 0.45 |
| 17 | DAP | 1000 | 34.00 | 0.00 | 0.40 |
| 18 | DAP | 1000 | 36.00 | 0.00 | 0.35 |
| 19 | DAP | 1000 | 38.00 | 0.00 | 0.30 |
| 20 | DAP | 1000 | 40.00 | 0.00 | 0.25 |
| 21 | AP * | ∞ | 0.00 | -4.00 | 1.00 |

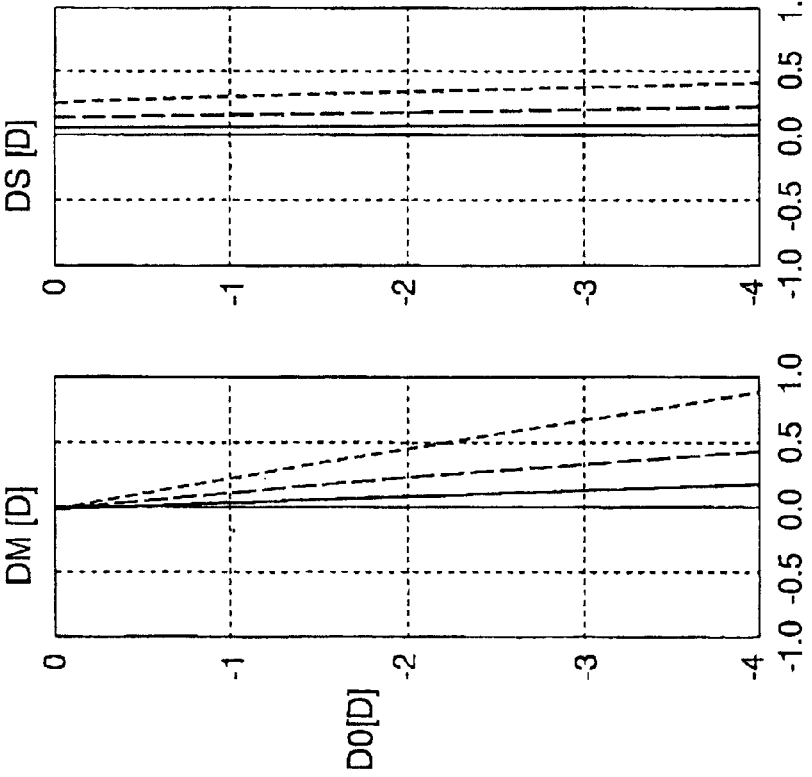

FIG. 15

| No. | PARAMETER | VALUE | VARIABLE |
|---|---|---|---|
| 1 | N | 1.600 | |
| 2 | DIA | 70.000 | |
| 3 | R1 * | 100.000 | |
| 4 | R2 | 284.657 | V |
| 5 | CT | 4.706 | V |
| 6 | K | 0.000 | |
| 7 | A04 | $-4.33059 \times 10^{-7}$ | V |
| 8 | A06 | $1.43607 \times 10^{-10}$ | V |
| 9 | A08 | $-3.83026 \times 10^{-14}$ | V |
| 10 | A10 | $4.89172 \times 10^{-18}$ | V |

FIG. 16

| No. | VE | OD | h | TV | WEIGHT |
|---|---|---|---|---|---|
| 1 | AS | -600 | 2.00 | 0.00 | 1.00 |
| 2 | AS | -600 | 4.00 | 0.00 | 1.00 |
| 3 | AS | -600 | 6.00 | 0.00 | 1.00 |
| 4 | AS | -600 | 8.00 | 0.00 | 1.00 |
| 5 | AS | -600 | 10.00 | 0.00 | 1.00 |
| 6 | AS | -600 | 12.00 | 0.00 | 0.95 |
| 7 | AS | -600 | 14.00 | 0.00 | 0.90 |
| 8 | AS | -600 | 16.00 | 0.00 | 0.85 |
| 9 | AS | -600 | 18.00 | 0.00 | 0.80 |
| 10 | AS | -600 | 20.00 | 0.00 | 0.75 |
| 11 | AS | -600 | 22.00 | 0.00 | 0.70 |
| 12 | AS | -600 | 24.00 | 0.00 | 0.65 |
| 13 | AS | -600 | 26.00 | 0.00 | 0.60 |
| 14 | AS | -600 | 28.00 | 0.00 | 0.55 |
| 15 | AS | -600 | 30.00 | 0.00 | 0.50 |
| 16 | AS | -600 | 32.00 | 0.00 | 0.45 |
| 17 | AS | -600 | 34.00 | 0.00 | 0.40 |
| 18 | AS | -600 | 36.00 | 0.00 | 0.35 |
| 19 | AS | -600 | 38.00 | 0.00 | 0.30 |
| 20 | AS | -600 | 40.00 | 0.00 | 0.25 |
| 21 | AP * | ∞ | 0.00 | 4.00 | 1.00 |
| 22 | T * | | 35.00 | 1.00 | 1.00 |

—— D0= 0
— — D0=-2
- - - D0=-4

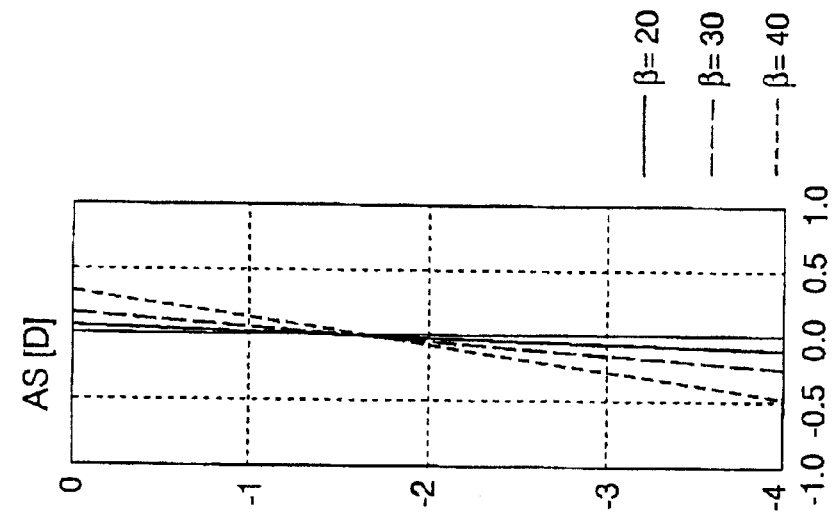
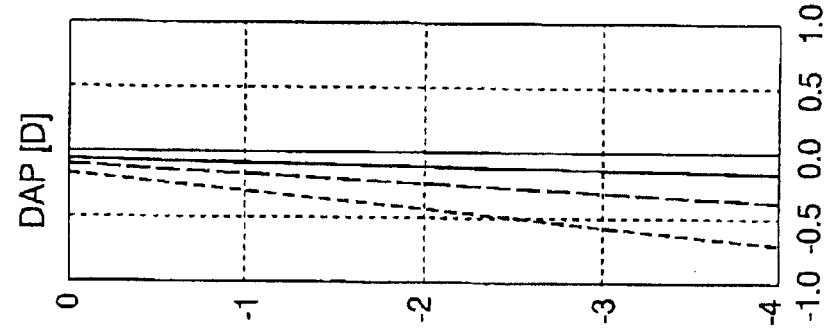
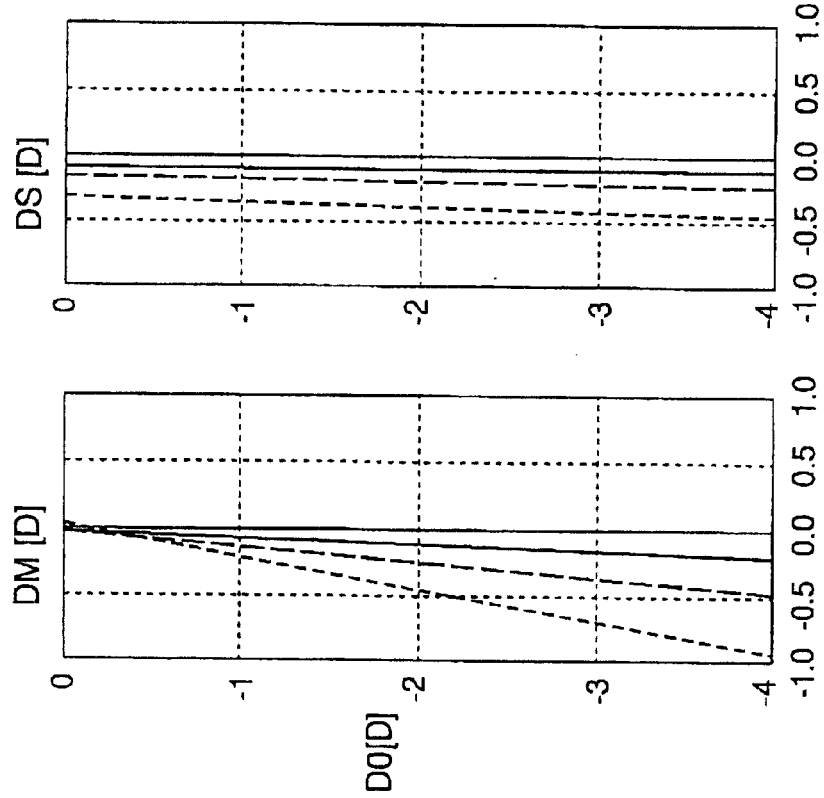

FIG. 19

| No. | PARAMETER | VALUE | VARIABLE |
|---|---|---|---|
| 1 | N | 1.600 | |
| 2 | DIA | 70.000 | |
| 3 | R1 * | 300.000 | |
| 4 | R2 | 85.684 | V |
| 5 | CT | 1.000 | |
| 6 | K | 0.000 | |
| 7 | A04 | $3.39896 \times 10^{-7}$ | V |
| 8 | A06 | $-2.59922 \times 10^{-10}$ | V |
| 9 | A08 | $9.63517 \times 10^{-14}$ | V |
| 10 | A10 | $-1.61769 \times 10^{-17}$ | V |

FIG. 20

| No. | VE | OD | h | TV | WEIGHT |
|---|---|---|---|---|---|
| 1 | DM | -1000 | 2.00 | 0.00 | 1.00 |
| 2 | DM | -1000 | 4.00 | 0.00 | 1.00 |
| 3 | DM | -1000 | 6.00 | 0.00 | 1.00 |
| 4 | DM | -1000 | 8.00 | 0.00 | 1.00 |
| 5 | DM | -1000 | 10.00 | 0.00 | 1.00 |
| 6 | DM | -1000 | 12.00 | 0.00 | 0.95 |
| 7 | DM | -1000 | 14.00 | 0.00 | 0.90 |
| 8 | DM | -1000 | 16.00 | 0.00 | 0.85 |
| 9 | DM | -1000 | 18.00 | 0.00 | 0.80 |
| 10 | DM | -1000 | 20.00 | 0.00 | 0.75 |
| 11 | DM | -1000 | 22.00 | 0.00 | 0.70 |
| 12 | DM | -1000 | 24.00 | 0.00 | 0.65 |
| 13 | DM | -1000 | 26.00 | 0.00 | 0.60 |
| 14 | DM | -1000 | 28.00 | 0.00 | 0.55 |
| 15 | DM | -1000 | 30.00 | 0.00 | 0.50 |
| 16 | DM | -1000 | 32.00 | 0.00 | 0.45 |
| 17 | DM | -1000 | 34.00 | 0.00 | 0.40 |
| 18 | DM | -1000 | 36.00 | 0.00 | 0.35 |
| 19 | DM | -1000 | 38.00 | 0.00 | 0.30 |
| 20 | DM | -1000 | 40.00 | 0.00 | 0.25 |
| 21 | AP * | ∞ | 0.00 | -5.00 | 1.00 |

FIG. 23

| No. | PARAMETER | VALUE | VARIABLE |
|---|---|---|---|
| 1 | N | 1.600 | |
| 2 | DIA | 70.000 | |
| 3 | R1 | 120.000 | |
| 4 | R2 * | 291.284 | V |
| 5 | CT | 3.785 | V |
| 6 | K | 0.000 | |
| 7 | A04 | $4.00381 \times 10^{-7}$ | V |
| 8 | A06 | $-2.31988 \times 10^{-10}$ | V |
| 9 | A08 | $8.07506 \times 10^{-14}$ | V |
| 10 | A10 | $-1.22162 \times 10^{-17}$ | V |

FIG. 24

| No. | VE | OD | h | TV | WEIGHT |
|---|---|---|---|---|---|
| 1 | ASavg | ∞/-300 | 2.00 | 0.00 | 1.00 |
| 2 | ASavg | ∞/-300 | 4.00 | 0.00 | 1.00 |
| 3 | ASavg | ∞/-300 | 6.00 | 0.00 | 1.00 |
| 4 | ASavg | ∞/-300 | 8.00 | 0.00 | 1.00 |
| 5 | ASavg | ∞/-300 | 10.00 | 0.00 | 1.00 |
| 6 | ASavg | ∞/-300 | 12.00 | 0.00 | 0.95 |
| 7 | ASavg | ∞/-300 | 14.00 | 0.00 | 0.90 |
| 8 | ASavg | ∞/-300 | 16.00 | 0.00 | 0.85 |
| 9 | ASavg | ∞/-300 | 18.00 | 0.00 | 0.80 |
| 10 | ASavg | ∞/-300 | 20.00 | 0.00 | 0.75 |
| 11 | ASavg | ∞/-300 | 22.00 | 0.00 | 0.70 |
| 12 | ASavg | ∞/-300 | 24.00 | 0.00 | 0.65 |
| 13 | ASavg | ∞/-300 | 26.00 | 0.00 | 0.60 |
| 14 | ASavg | ∞/-300 | 28.00 | 0.00 | 0.55 |
| 15 | ASavg | ∞/-300 | 30.00 | 0.00 | 0.50 |
| 16 | ASavg | ∞/-300 | 32.00 | 0.00 | 0.45 |
| 17 | ASavg | ∞/-300 | 34.00 | 0.00 | 0.40 |
| 18 | ASavg | ∞/-300 | 36.00 | 0.00 | 0.35 |
| 19 | ASavg | ∞/-300 | 38.00 | 0.00 | 0.30 |
| 20 | ASavg | ∞/-300 | 40.00 | 0.00 | 0.25 |
| 21 | AP * | ∞ | 0.00 | 3.00 | 1.00 |
| 22 | T * | | 35.00 | 1.00 | 1.00 |

FIG. 27

| No. | PARAMETER | VALUE | VARIABLE |
|---|---|---|---|
| 1 | N | 1.600 | |
| 2 | DIA | 70.000 | |
| 3 | R1 | 300.000 | |
| 4 | R2 * | 59.985 | V |
| 5 | CT | 1.000 | |
| 6 | K | 0.000 | |
| 7 | A04 | $5.44562 \times 10^{-7}$ | V |
| 8 | A06 | $-1.27186 \times 10^{-9}$ | V |
| 9 | A08 | $1.35920 \times 10^{-12}$ | V |
| 10 | A10 | $-3.13132 \times 10^{-16}$ | V |

FIG. 31

| No. | PARAMETER | VALUE | VARIABLE |
|---|---|---|---|
| 1 | N | 1.600 | |
| 2 | DIA | 70.000 | |
| 3 | R1 * | 75.000 | |
| 4 | R2 | 261.806 | V |
| 5 | CT | 7.038 | V |
| 6 | K | 0.000 | |
| 7 | A04 | $5.01035 \times 10^{-8}$ | V |
| 8 | A06 | $-3.71853 \times 10^{-10}$ | V |
| 9 | A08 | $1.89459 \times 10^{-13}$ | V |
| 10 | A10 | $-3.55130 \times 10^{-17}$ | V |

FIG. 28

| No. | VE | OD | h | TV | WEIGHT |
|---|---|---|---|---|---|
| 1 | DAP | ∞ | 2.00 | 0.00 | 1.00 |
| 2 | DAP | ∞ | 4.00 | 0.00 | 1.00 |
| 3 | DAP | ∞ | 6.00 | 0.00 | 1.00 |
| 4 | DAP | ∞ | 8.00 | 0.00 | 1.00 |
| 5 | DAP | ∞ | 10.00 | 0.00 | 1.00 |
| 6 | DAP | ∞ | 12.00 | 0.00 | 0.95 |
| 7 | DAP | ∞ | 14.00 | 0.00 | 0.90 |
| 8 | DAP | ∞ | 16.00 | 0.00 | 0.85 |
| 9 | DAP | ∞ | 18.00 | 0.00 | 0.80 |
| 10 | DAP | ∞ | 20.00 | 0.00 | 0.75 |
| 11 | DAP | ∞ | 22.00 | 0.00 | 0.70 |
| 12 | DAP | ∞ | 24.00 | 0.00 | 0.65 |
| 13 | DAP | ∞ | 26.00 | 0.00 | 0.60 |
| 14 | DAP | ∞ | 28.00 | 0.00 | 0.55 |
| 15 | DAP | ∞ | 30.00 | 0.00 | 0.50 |
| 16 | DAP | ∞ | 32.00 | 0.00 | 0.45 |
| 17 | DAP | ∞ | 34.00 | 0.00 | 0.40 |
| 18 | DAP | ∞ | 36.00 | 0.00 | 0.35 |
| 19 | DAP | ∞ | 38.00 | 0.00 | 0.30 |
| 20 | DAP | ∞ | 40.00 | 0.00 | 0.25 |
| 21 | AS | ∞ | 2.00 | 0.00 | 1.00 |
| 22 | AS | ∞ | 4.00 | 0.00 | 1.00 |
| 23 | AS | ∞ | 6.00 | 0.00 | 1.00 |
| ... | ... | ... | ... | ... | ... |
| 39 | AS | ∞ | 38.00 | 0.00 | 0.30 |
| 40 | AS | ∞ | 40.00 | 0.00 | 0.25 |
| 41 | DAP | -300 | 2.00 | 0.00 | 1.00 |
| 42 | DAP | -300 | 4.00 | 0.00 | 1.00 |
| 43 | DAP | -300 | 6.00 | 0.00 | 1.00 |
| ... | ... | ... | ... | ... | ... |
| 59 | DAP | -300 | 38.00 | 0.00 | 0.30 |
| 60 | DAP | -300 | 40.00 | 0.00 | 0.25 |
| 61 | AS | -300 | 2.00 | 0.00 | 1.00 |
| 62 | AS | -300 | 4.00 | 0.00 | 1.00 |
| 63 | AS | -300 | 6.00 | 0.00 | 1.00 |
| ... | ... | ... | ... | ... | ... |
| 79 | AS | -300 | 38.00 | 0.00 | 0.30 |
| 80 | AS | -300 | 40.00 | 0.00 | 0.25 |
| 81 | AP * | ∞ | 0.00 | -8.00 | 1.00 |

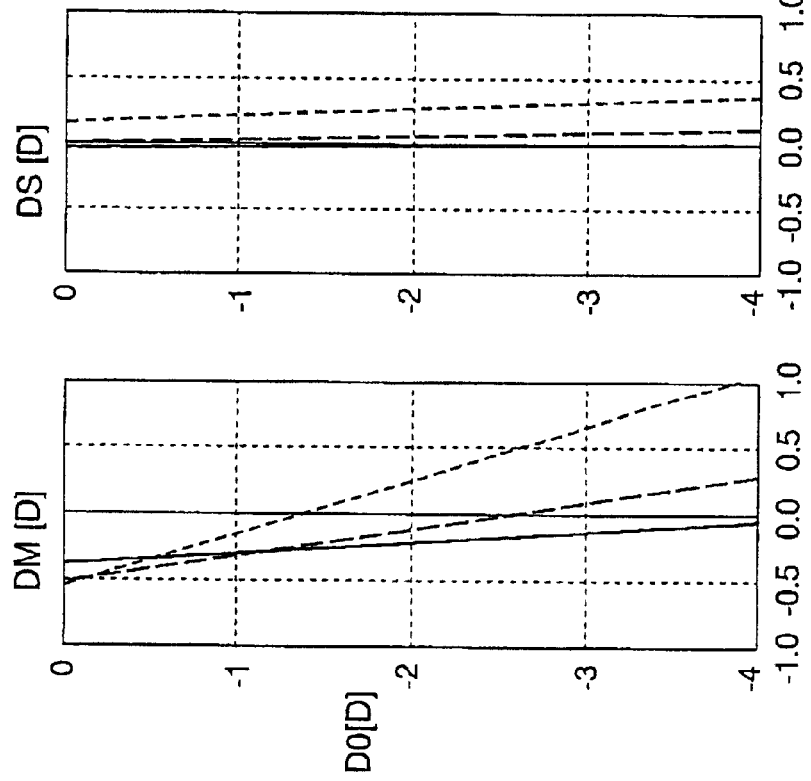
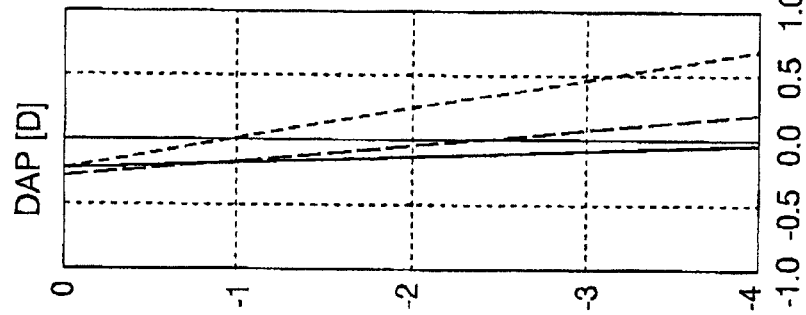
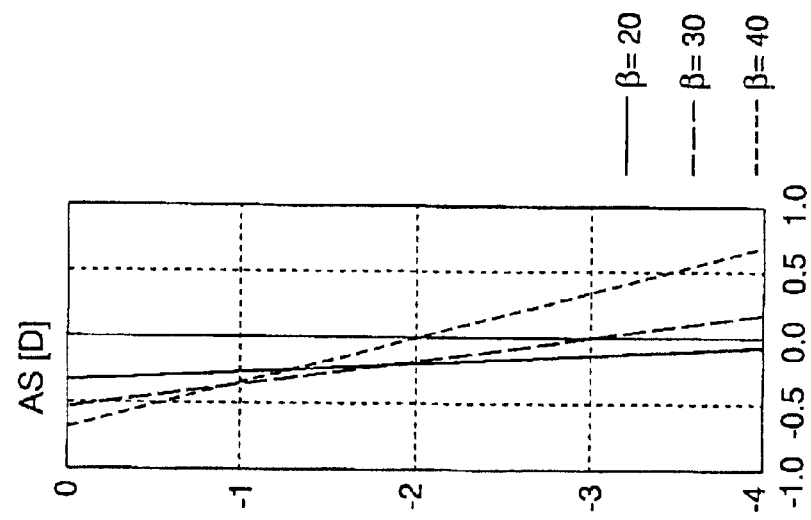

FIG. 32

| No. | VE | OD | h | TV | WEIGHT |
|---|---|---|---|---|---|
| 1 | DAP | ∞ | 2.00 | 0.00 | 1.00 |
| 2 | DAP | ∞ | 4.00 | 0.00 | 1.00 |
| 3 | DAP | ∞ | 6.00 | 0.00 | 1.00 |
| 4 | DAP | ∞ | 8.00 | 0.00 | 1.00 |
| 5 | DAP | ∞ | 10.00 | 0.00 | 1.00 |
| 6 | DAP | ∞ | 12.00 | 0.00 | 0.95 |
| 7 | DAP | ∞ | 14.00 | 0.00 | 0.90 |
| 8 | DAP | ∞ | 16.00 | 0.00 | 0.85 |
| 9 | DAP | ∞ | 18.00 | 0.00 | 0.80 |
| 10 | DAP | ∞ | 20.00 | 0.00 | 0.75 |
| 11 | DAP | ∞ | 22.00 | 0.00 | 0.70 |
| 12 | DAP | ∞ | 24.00 | 0.00 | 0.65 |
| 13 | DAP | ∞ | 26.00 | 0.00 | 0.60 |
| 14 | DAP | ∞ | 28.00 | 0.00 | 0.55 |
| 15 | DAP | ∞ | 30.00 | 0.00 | 0.50 |
| 16 | DAP | ∞ | 32.00 | 0.00 | 0.45 |
| 17 | DAP | ∞ | 34.00 | 0.00 | 0.40 |
| 18 | DAP | ∞ | 36.00 | 0.00 | 0.35 |
| 19 | DAP | ∞ | 38.00 | 0.00 | 0.30 |
| 20 | DAP | ∞ | 40.00 | 0.00 | 0.25 |
| 21 | AS | ∞ | 2.00 | 0.00 | 1.00 |
| 22 | AS | ∞ | 4.00 | 0.00 | 1.00 |
| 23 | AS | ∞ | 6.00 | 0.00 | 1.00 |
| ... | ... | ... | ... | ... | ... |
| 39 | AS | ∞ | 38.00 | 0.00 | 0.30 |
| 40 | AS | ∞ | 40.00 | 0.00 | 0.25 |
| 41 | DAP | -300 | 2.00 | 0.00 | 1.00 |
| 42 | DAP | -300 | 4.00 | 0.00 | 1.00 |
| 43 | DAP | -300 | 6.00 | 0.00 | 1.00 |
| ... | ... | ... | ... | ... | ... |
| 59 | DAP | -300 | 38.00 | 0.00 | 0.30 |
| 60 | DAP | -300 | 40.00 | 0.00 | 0.25 |
| 61 | AS | -300 | 2.00 | 0.00 | 1.00 |
| 62 | AS | -300 | 4.00 | 0.00 | 1.00 |
| 63 | AS | -300 | 6.00 | 0.00 | 1.00 |
| ... | ... | ... | ... | ... | ... |
| 79 | AS | -300 | 38.00 | 0.00 | 0.30 |
| 80 | AS | -300 | 40.00 | 0.00 | 0.25 |
| 81 | AP * | ∞ | 0.00 | 6.00 | 1.00 |
| 82 | T * |  | 35.00 | 1.00 | 1.00 |

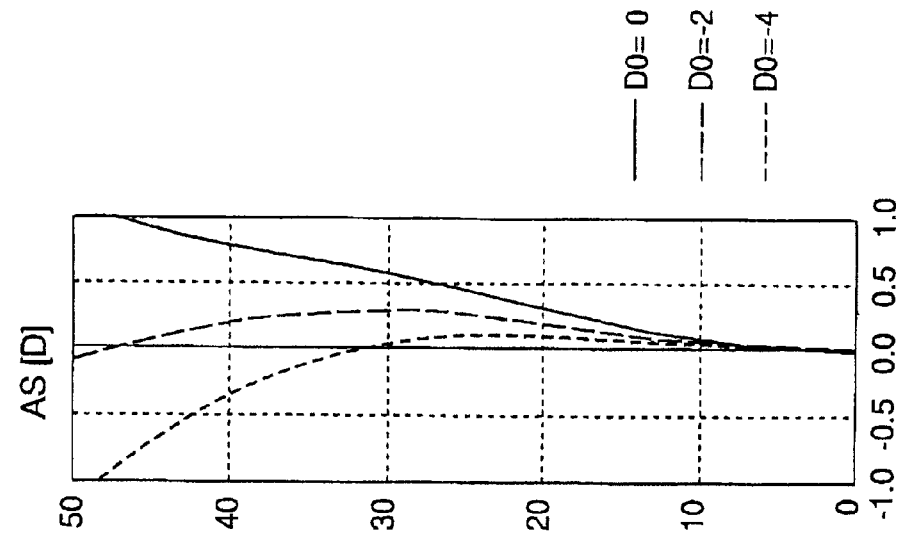
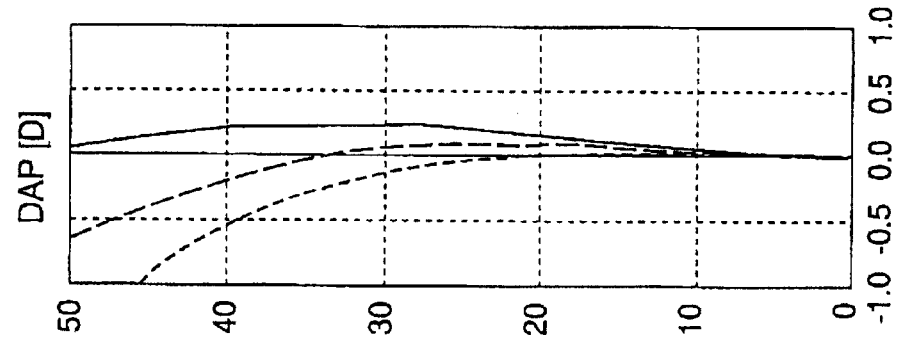
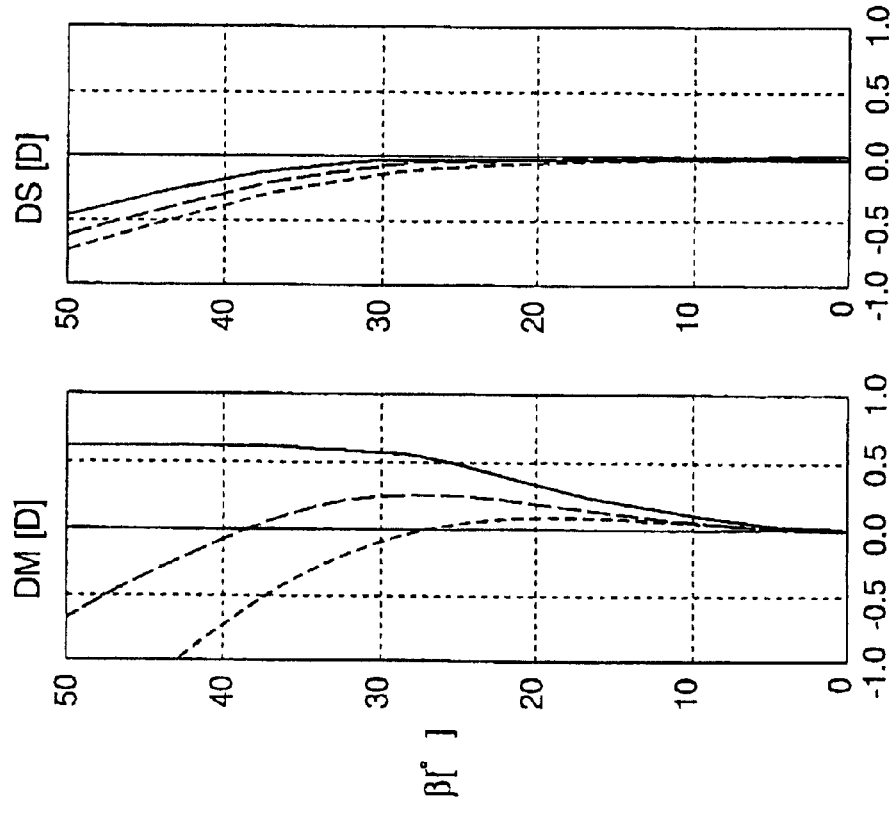
FIG.33A FIG.33B FIG.33C FIG.33D

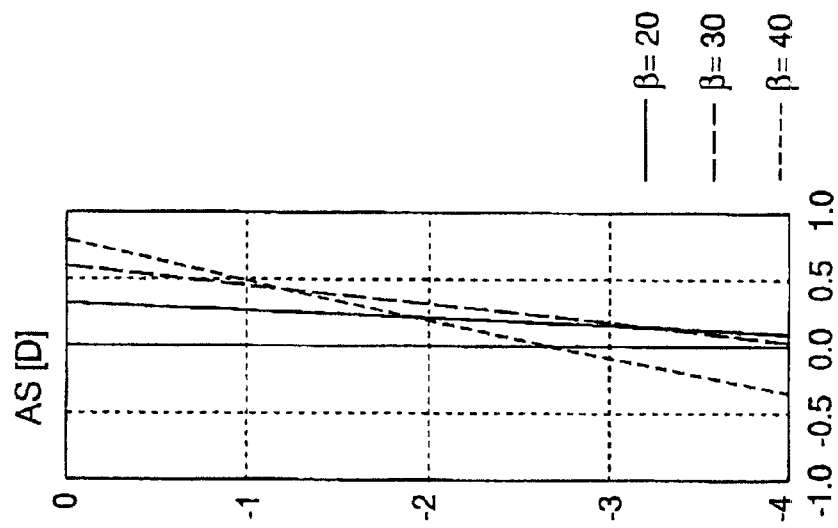
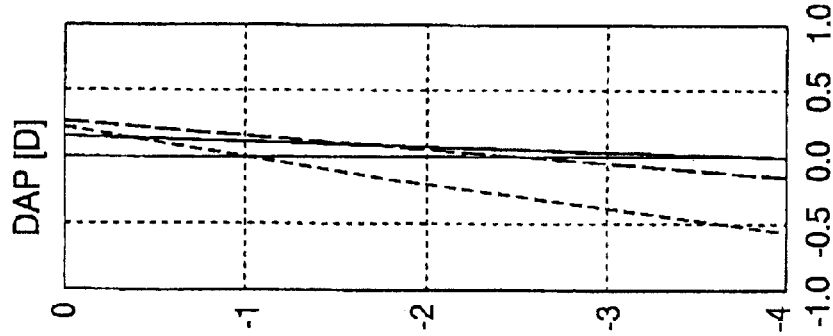
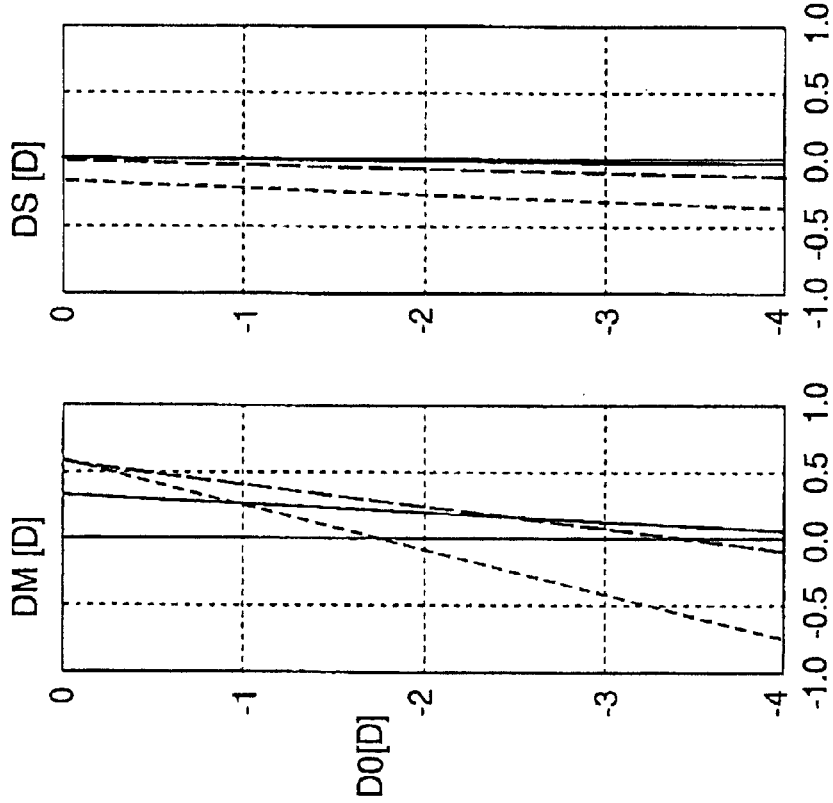

METHODS FOR DESIGNING AND MANUFACTURING SINGLE-VISION SPECTACLE LENS AND MANUFACTURING SYSTEM THEREOF

BACKGROUND OF THE INVENTION

The present invention relates to methods for designing and manufacturing a rotationally symmetrical single-vision spectacle lens whose at least one of front and back surfaces is an aspherical surface, and a manufacturing system thereof.

Many spectacle lenses employ aspherical surfaces at one of front and back surfaces. When a spectacle lens employs an aspherical surface, the curvature becomes smaller while keeping a predetermined power as compared with a lens whose front and back surfaces are spherical, which decreases the maximum thickness of the lens.

When a rotationally symmetrical single-vision spectacle lens is designed, lens material and a vertex power are given as a specification. According to this specification and additional specification, a combination of shapes of front and back surfaces is found such that optical aberrations are minimized. The shape of the lens surface is calculated using an optimizing algorithm such as a damped least squares method. In the optimizing process, one or more (five or six, in general) lens parameters are selected as variables from among a plurality of lens parameters that define the spectacle lens, and values of optical aberration at evaluation points whose distances from the optical axis are different to one another are employed as evaluation functions.

The lens parameters include refractive index of the lens material, a diameter of the lens, a radius of curvature of the front surface, a radius of curvature of the back surface, a center thickness, a conic coefficient and high-order aspherical surface coefficients. A few lens parameters are selected to be variables. The refractive index and the diameter of lens are usually set as constants. The center thickness is set as a constant when a minus lens is designed, and it should be a variable to keep an appropriate edge thickness when a plus lens is designed. While both of the radii of curvatures of the front and back surfaces may be variables, one of them is set as a constant and the other is set as a variable in general. Since the conic coefficient is closely related to the high-order aspherical surface coefficients, the conic coefficient is set as a constant and the high-order aspherical surface coefficients are set as variables.

On the other hand, a vertex power can be employed as the evaluation function at the center of the lens. At each evaluation point, optical aberrations such as power error, astigmatism and distortion, and a performance according to the lens shape such as a thickness of the lens and the aspherical amount can be employed as the evaluation functions. The power error can be selected from among meridional power error, sagittal power error and average power error defined as average of the meridional and sagittal power errors.

The weighted square of difference between the value of the evaluation function and a desired target value is calculated for each of the evaluation points, the best possible combination of variables, where a merit function that is the total sum of the weighted square of differences is minimized, is found. In the damped least squares process, the best possible combination of variables is found while damping the variations of variables in consideration of nonlinearity of the system and dependence among the variables. Equality constraints may be defined for a few evaluation functions.

Since a single-vision spectacle lens is assumed to be used for various object distances, the optical performance should be balanced within a range of the object distance from 30 cm to infinity. Thus, in a conventional design method of a single-vision spectacle lens, the aberrations at the infinite and finite object distances are used as the evaluation functions at the same time, and the lens parameters are optimized such that the merit function containing these evaluation functions is minimized.

Two examples of the conventional design methods with the damped leased squares method will be described. FIGS. 27 to 30D show data and performance of a spectacle lens that is designed by a first conventional design method. In this example, a spherical power (SPH) is −8.00 diopter, the front surface is spherical and the back surface is aspherical. A rotationally-symmetrical aspherical surface is expressed by the following equation:

$$X(h) = \frac{h^2 c}{1 + \sqrt{1 - (1+\kappa)h^2 c^2}} + A_4 h^4 + A_6 h^6 + A_8 h^8 + A_{10} h^{10} + A_{12} h^{12} \cdots$$

X(h) is a sag, that is, a distance of a curve from a tangential plane at a point on the surface where the height from the optical axis is h. Symbol c is a curvature (1/r) of the vertex of the surface, K is a conic coefficient, $A_4$, $A_6$, $A_8$ and $A_{10}$ are aspherical surface coefficients of fourth, sixth, eighth and tenth orders, respectively.

As shown in FIG. 27, the refractive index N, the lens diameter DIA, the radius of curvature R1 of the front surface, the radius of curvature R2 of the back surface, the center thickness CT, the conic coefficient κ and the high-order aspherical surface coefficients $A_4$, $A_6$, $A_8$, $A_{10}$ are the lens parameters. The parameters whose rightmost column "VARIABLE" are checked by marks "V" are the variables. Namely, R2 and $A_4$, $A_6$, $A_8$, $A_{10}$ are set as variables and the other parameters are constants. The numerical values of the variables in the column "VALUE" are the final values after optimization.

As shown in FIG. 28, the average power errors DAP and the astigmatisms AS at the infinite object distance on different evaluation points, and the average power errors DAP and the astigmatisms AS at the finite object distance −300 mm (the object distance takes minus value at a object side with respect to the lens) on the evaluation points are assigned to the evaluation functions as the optical aberrations, the vertex power AP at the lens center is added as the equality constraint. In the table of FIG. 28, "VE" denotes the evaluation function, "OD" denotes the object distance, "h" denotes the distance of the evaluation point from the optical axis and "TV" denotes the target value. The twenty evaluation points whose distances from the optical axis are different to one another are set on the lens surface. The center evaluation point is on the optical axis (the distance is 0 mm) and the distance of the farthest evaluation point is 40 mm. The interval of the evaluation points is 2 mm. The total number of the evaluation functions is 81 because four kinds of the optical aberration at the twenty evaluation points and the vertex power AP are employed. The target values of the evaluation functions regarding the optical aberration are zero. The target value of the evaluation function regarding the vertex power is set as −8.00. As shown by the values in the column "WEIGHT" of FIG. 28, evaluated values, which are the differences between the values of the evaluation functions and the target values, are weighted such that the weight decreases with the distance from the optical axis, and the variables are optimized using the damped least squares method.

FIGS. 29A–29D are graphs showing the optical aberrations of the optimized spectacle lens of the first conventional design with respect to a visual angle β (unit: degrees) as the vertical axis; FIG. 29A shows the meridional power error DM, FIG. 29B shows the sagittal power error DS, FIG. 29C shows the average power error DAP and FIG. 29D shows the astigmatism AS. The solid line represents the aberration when the object visual diopter, which is a reciprocal of the object distance (unit: m), is 0 D (equivalent to the infinite object distance), the long dashed line represents the aberration when the object visual diopter is −2 D (the object distance −500 mm) and the short dashed line represents the aberration when the object visual diopter is −4 D (the object distance −250 mm).

Further, FIGS. 30A–30D are graphs showing the optical aberrations of the optimized spectacle lens of the first conventional design with respect to the object visual diopter DO (unit: D) as the vertical axis; FIG. 30A shows the meridional power error DM, FIG. 30B shows the sagittal power error DS, FIG. 30C shows the average power error DAP and FIG. 30D shows the astigmatism AS. The solid line represents the aberration when the visual angle is 20 degrees, the long dashed line represents the aberration when the visual angle is 30 degrees and the short dashed line represents the aberration when the visual angle is 40 degrees.

FIGS. 29A–29D show that the various aberrations vary undulately but not monotonously with respect to the change of the visual angle β. FIGS. 30A–30D show that the object visual diopter for the minimum aberration varies depending on the visual angle and that the far-and-near balance varies depending on the visual angle β.

FIGS. 31 to 34D show data and performance of a spectacle lens that is designed by a second conventional design method. In this example, a spherical power (SPH) is +6.00 diopter, the front surface is aspherical and the back surface is spherical. The sort of the lens parameters is the same as the first conventional design method. The parameters whose rightmost column "VARIABLE" are checked by marks "V" are the variables. Namely, the radius of curvature R2 of the back surface, the center thickness CT and the high-order aspherical surface coefficients $A_4$, $A_6$, $A_8$, $A_{10}$ are set as variables and the other parameters are constants.

As shown in FIG. 32, the average power errors DAP and the astigmatisms AS at the infinite and finite (−300 mm) object distances on the evaluation points are assigned to the evaluation functions as the optical aberrations, the vertex power AP and the edge thickness T are added as the equality constraints. The total number of the evaluation functions is 82. The evaluated values are weighted in the same manner as the first conventional design method, and the variables are optimized using the damped least squares method.

FIGS. 33A–33D are graphs showing the optical aberrations of the optimized spectacle lens of the second conventional design with respect to the visual angle β (unit: degrees) as the vertical axis. FIGS. 34A–34D are graphs showing the optical aberrations of the optimized spectacle lens of the second conventional design with respect to the object visual diopter DO (unit: D) as the vertical axis. These graphs show that the various aberrations undulate with respect to the visual angle β and that the far-and-near balance varies depending on the visual angle β.

As described above, since the conventional design methods employ a great number of the evaluation functions, the cost of calculation becomes large and the far-and-near balance varies depending on the visual angle β.

Further, since it is impossible to take all of the evaluation functions as zero in theory and the aberration undulates with respect to the visual angle β when the weighting is constant, an operator is required to control the weighting to direct the aberrations toward the desired target values. This increases labor cost, and the optimized results for the same specification may be different according to the operators.

Still further, in the conventional design methods, since there are a great number of the evaluation functions, the variation of the merit function is exceedingly complex. As a result, there is the potential that the merit function is trapped in local minimum. That is, there is a high possibility that the optimizing is stopped at the local minimum that is not true minimum. In order to avoid trapping, the operator must monitor the condition of the optimization.

Such an intervention of the operator presents no problem when a single-vision spectacle lens is designed as a ready-made article within a range of manufacturing. However, when a single-vision spectacle lens is designed as a custom-made article, since the lens having the optimum optical performance should be designed based on various special orders such as a curve, a diameter, a lens type and a shape balance between right and left lenses, which are designated by a customer, the intervention of the operator presents problem from viewpoints of the cost and the design repeatability. That is, the same result is not always obtained based on the same specification.

SUMMARY OF THE INVENTION

It is therefore an object of the present invention to provide a design method of a spectacle lens, which is capable of finding the most suitable solution in short time without an operator and of reducing the variation of the far-and-near balance depending on the visual angle. Further object of the present invention is to provide manufacturing method and system employing the design method.

For the above object, according to the present invention, there is provided an improved design method of a spectacle lens, which includes step for selecting one or more lens parameters as variables among a plurality of lens parameters, step for assigning values of the same optical aberration at different evaluation points on the lens to all of evaluation functions that evaluate optical aberration and step for optimizing the selected lens parameters by setting target values of the evaluation functions to zero. In general, there are a great number of evaluation functions including the equality constraints. The evaluation function may evaluate optical aberration or a lens parameter. In the present invention, the evaluation functions that evaluate the optical aberration are defined as the values of the same optical aberration at the different evaluation points. Since the lens parameter is usually employed as the equality constraint, the assigning step may be defined to select values of only one optical aberration for the evaluation functions except equality constraints.

The optimizing step includes repetition of step for calculating the magnitudes of the evaluation functions and step for adjusting the values of the selected lens parameters such that the evaluation functions are closer to zero. That is, the values of the selected lens parameters are adjusted such that the merit function, which is the total sum of the weighted square of the differences between the evaluation functions and the target values, is minimized.

With this method, the small number of the evaluation functions reduces the cost of calculation and it is possible to take all of the final values of the evaluation functions regarding the optical aberration as zero. Therefore, it is unnecessary that an operator intervenes to control the weighting and to monitor the condition of the optimization, which reduces the labor cost and keeps the design repeatability. Further, the variation of the far-and-near balance depending on the visual angle can be reduced in spite of assigning the values of the same optical aberration to all of the evaluation functions.

The optical aberration employed as the evaluation function can be selected from among meridional power error, sagittal power error and aberration defined as a weighted sum thereof. As shown in FIGS. 30A–30D and FIGS. 34A–34D for the conventional design methods, the meridional power error DM, the sagittal power error DS, the average power error DAP and the astigmatism AS vary linearly with respect to the object visual diopter. Further, the following relationships are held at the specific visual angle.

$$DM \approx A \times DO + B$$

$$DS \approx C$$

$$DAP = (DM + DS)/2 \approx A/2 \times DO + (B+C)/2$$

$$AS = DM - DS \approx A \times DO + (B-C)$$

Where A, B and C are constants.

The slope A of the straight line indicating the meridional power error DM depends on the base curve of the lens and it does not vary regardless of the small change of the aspherical surface. The sagittal power error DS is almost constant regardless of the object distance. Accordingly, if the optical aberrations DM, DS, DAP and AS, which are closely related to one another, are employed as the evaluation functions at the same time, it only increases in complexity of the merit function but does not increase the efficiency of the optimization. On the contrary, when the optical aberration is limited to one of the meridional power error DM, the average power error DAP that is found by 0.5×DM+0.5×DS, the astigmatism AS that is found by DM+(-1)×DS, the better result can be obtained in both of the calculation cost and the optical performance.

When the values of any one of the meridional power error, the average power error or the astigmatism are selected as the evaluation functions of the optimization, the solution where all of the evaluation functions become zero can be found by selecting a specific object distance (including a virtual distance at the side of an eye with respect to the lens). Therefore, when the object distance is properly selected and the target values of the evaluation functions are set as zero, the merit function reaches the most suitable solution with stability and the judgement of convergence of the optimization becomes easier. The evaluation functions may be the values of the optical aberration at a specific object distance or the calculated results of the values of the optical aberration at different object distances. In the later case, the evaluation functions may be averages of the values of the astigmatism at the two specific object distances. The object distances maybe infinity and −300 mm, for example.

In the optimizing step, either a least squares method or a damped least squares method can be employed as an optimizing algorithm. Equality constraints may be included in the optimizing. At least one of the minimum lens thickness and the vertex power may be included as the equality constraints. The vertex power may be adjusted by means of bending in place of the addition of the equality constraints.

On the other hand, the manufacturing method of the spectacle lens according to the invention includes step for selecting one or more lens parameters as variables among a plurality of lens parameters, step for assigning values of the same optical aberration at different evaluation points on the lens to all of evaluation functions, step for optimizing the selected lens parameters by setting target values of the evaluation functions to zero based on ordering data, step for calculating manufacturing data from the optimized lens parameters, and step for processing a refractive surface of the lens according to the manufacturing data. The optimizing step includes repetition of step for calculating the magnitudes of the evaluation functions and step for adjusting the values of the selected lens parameters such that the evaluation functions are closer to zero.

Further, the manufacturing system of the spectacle lens according to the invention includes an input device that is used for inputting ordering data that defines a specification of a spectacle lens, a calculating device that calculates an optimum lens shape from the ordering data, and a processing device that processes the lens based on the optimum lens shape. The calculating device selects one or more lens parameters as variables among a plurality of lens parameters and assigns values of the same optical aberration at different evaluation points on the lens to all of evaluation functions, and the calculating device optimizes the selected lens parameters by evaluating the evaluation functions.

DESCRIPTION OF THE ACCOMPANYING DRAWINGS

FIG. 3 is a table showing lens data of the spectacle lens according to a first embodiment;

FIG. 4 is a table showing evaluation functions of the spectacle lens according to the first embodiment;

FIG. 7 is a table showing lens data of the spectacle lens according to a second embodiment;

FIG. 8 is a table showing evaluation functions of the spectacle lens according to the second embodiment;

FIGS. 10A–10D are graphs showing optical aberrations of the optimized spectacle lens of the second embodiment with respect to an object visual diopter;

FIG. 11 is a table showing lens data of the spectacle lens according to a third embodiment;

FIG. 12 is a table showing evaluation functions of the spectacle lens according to the third embodiment;

FIGS. 14A–14D are graphs showing optical aberrations of the optimized spectacle lens of the third embodiment with respect to an object visual diopter;

FIG. 15 is a table showing lens data of the spectacle lens according to a fourth embodiment;

FIG. 16 is a table showing evaluation functions of the spectacle lens according to the fourth embodiment;

FIGS. 18A–18D are graphs showing optical aberrations of the optimized spectacle lens of the fourth embodiment with respect to an object visual diopter;

FIG. 19 is a table showing lens data of the spectacle lens according to a fifth embodiment;

FIG. 20 is a table showing evaluation functions of the spectacle lens according to the fifth embodiment;

FIG. 23 is a table showing lens data of the spectacle lens according to a sixth embodiment;

FIG. 24 is a table showing evaluation functions of the spectacle lens according to the sixth embodiment;

FIG. 27 is a table showing lens data of the spectacle lens according to a first conventional design;

FIG. 28 is a table showing evaluation functions of the spectacle lens according to the first conventional design;

FIGS. 30A–30D are graphs showing optical aberrations of the optimized spectacle lens of the first conventional design with respect to an object visual diopter;

FIG. 31 is a table showing lens data of the spectacle lens according to a second conventional design;

FIG. 32 is a table showing evaluation functions of the spectacle lens according to the second conventional design;

FIGS. 33A–33D are graphs showing optical aberrations of the optimized spectacle lens of the second conventional design with respect to a visual angle; and FIGS. 34A–34D are graphs showing optical aberrations of the optimized spectacle lens of the second conventional design with respect to an object visual diopter.

DESCRIPTION OF THE EMBODIMENTS

A design method, manufacturing method and system of a single-vision spectacle lens embodying the invention will be described with reference to the accompanying drawings. First, an outline of the manufacturing method is described with reference to FIGS. 1 and 2, and then concrete embodiments designed by the design method will be described.

Figure 1:
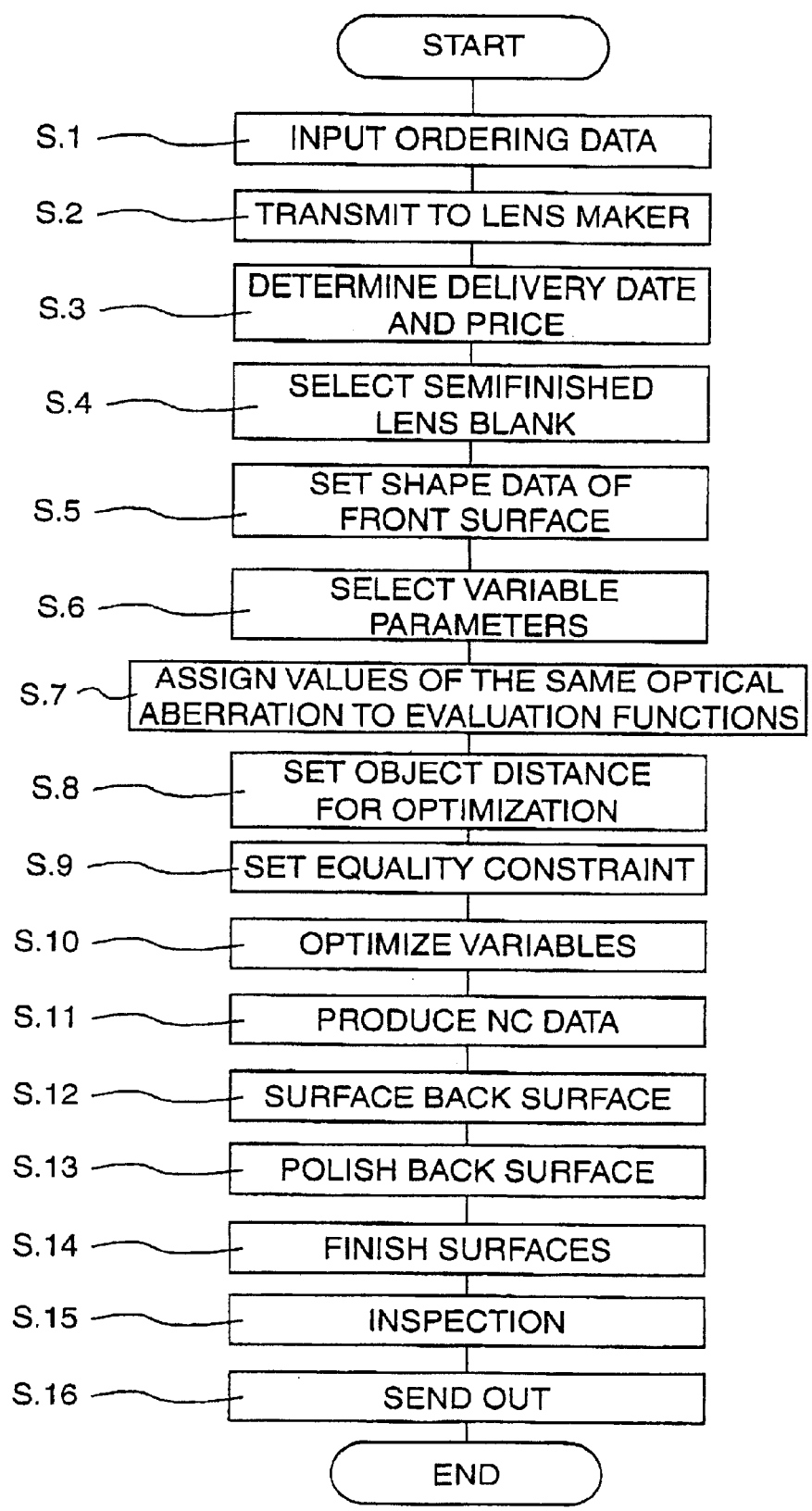
FIG. 1 is a flowchart showing a manufacturing method of a single-vision spectacle lens embodying the invention.
Figure 2:
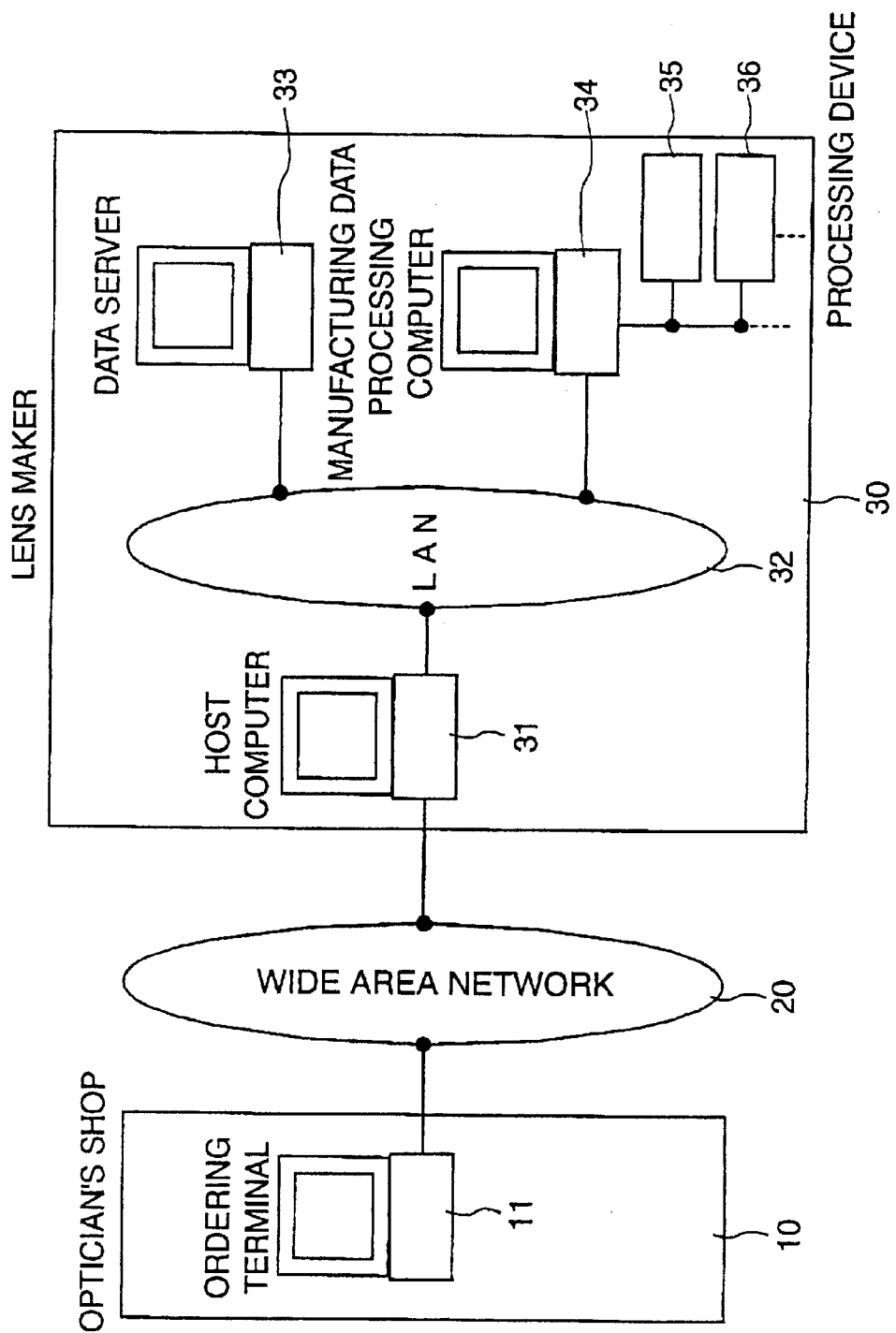
FIG. 2 is a block diagram showing a manufacturing system of a spectacle lens embodying the invention.
Figure 5:
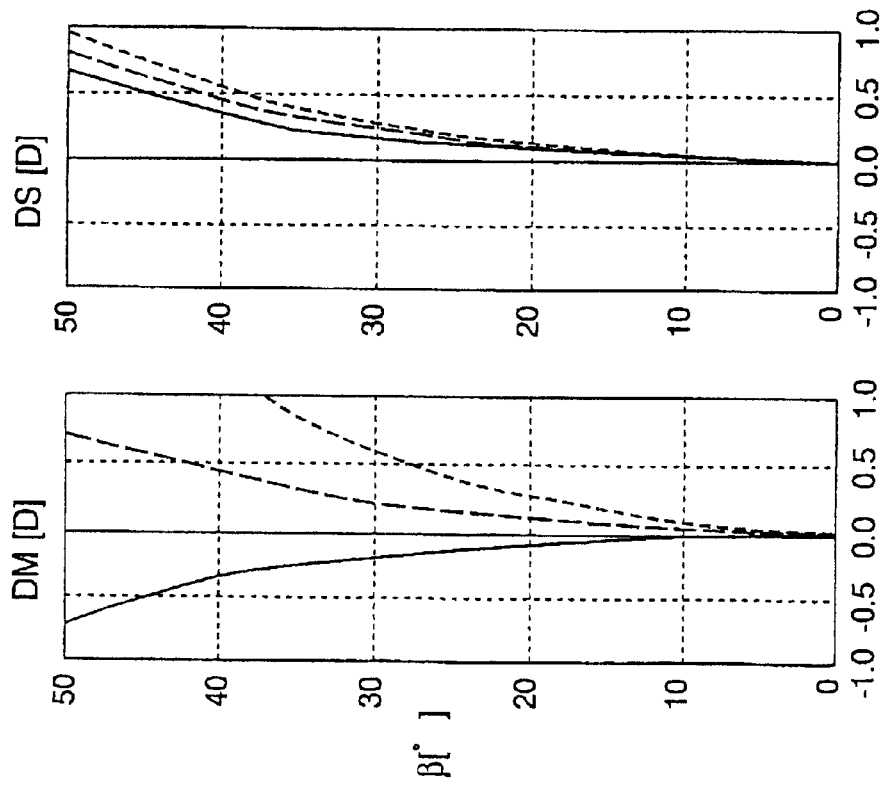
FIGS. 5A–5D are graphs showing optical aberrations of the optimized spectacle lens of the first embodiment with respect to a visual angle.
Figure 6:
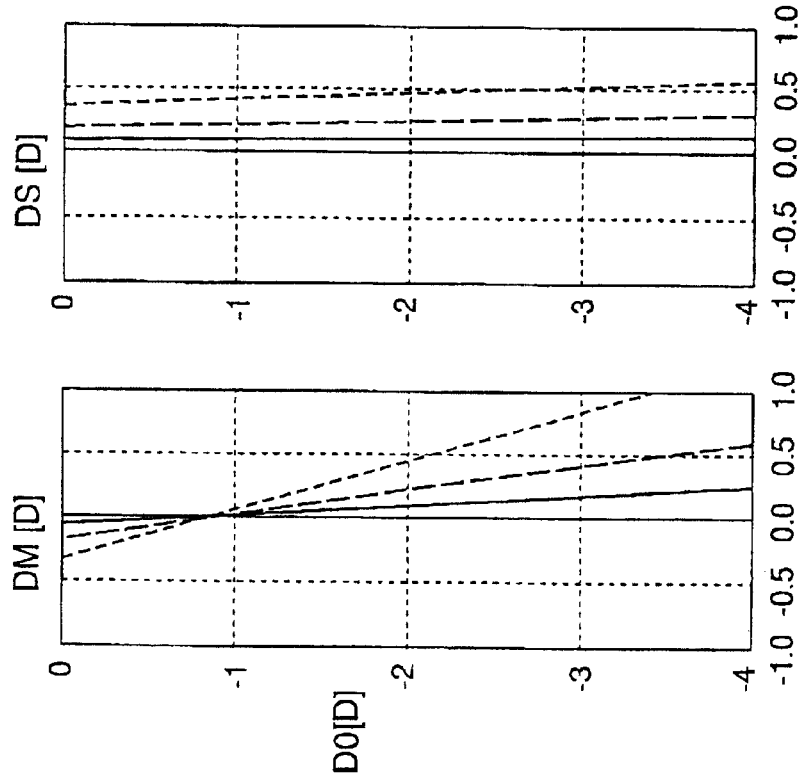
FIGS. 6A–6D are graphs showing optical aberrations of the optimized spectacle lens of the first embodiment with respect to an object visual diopter.
Figures 9A, 9B, 9C, 9D:
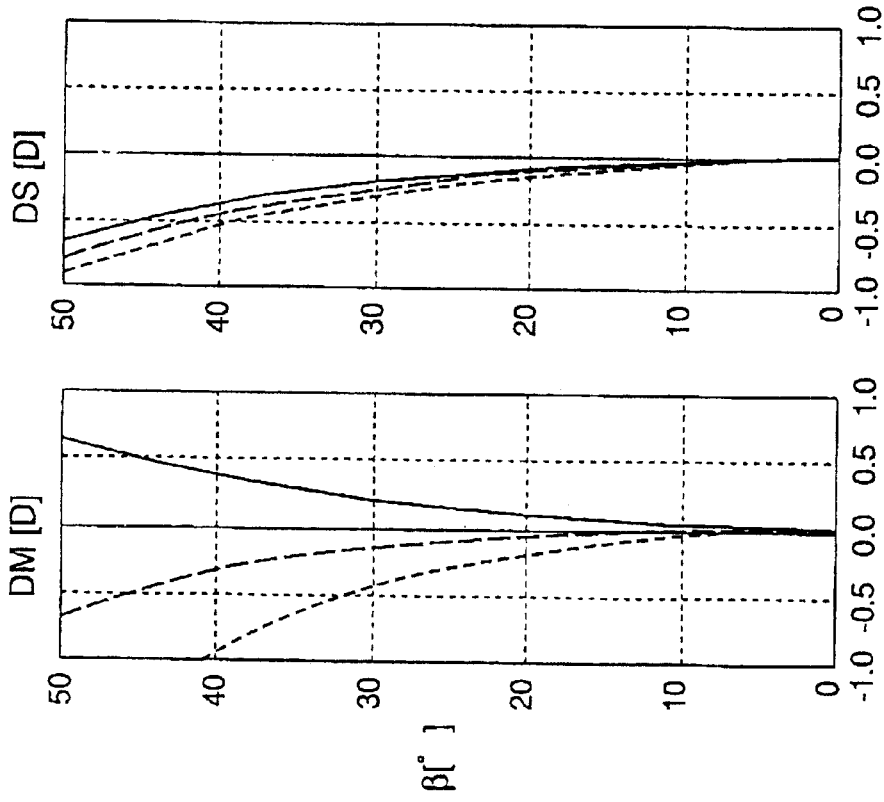
FIGS. 9A–9D are graphs showing optical aberrations of the optimized spectacle lens of the second embodiment with respect to a visual angle.
Figure 13A:
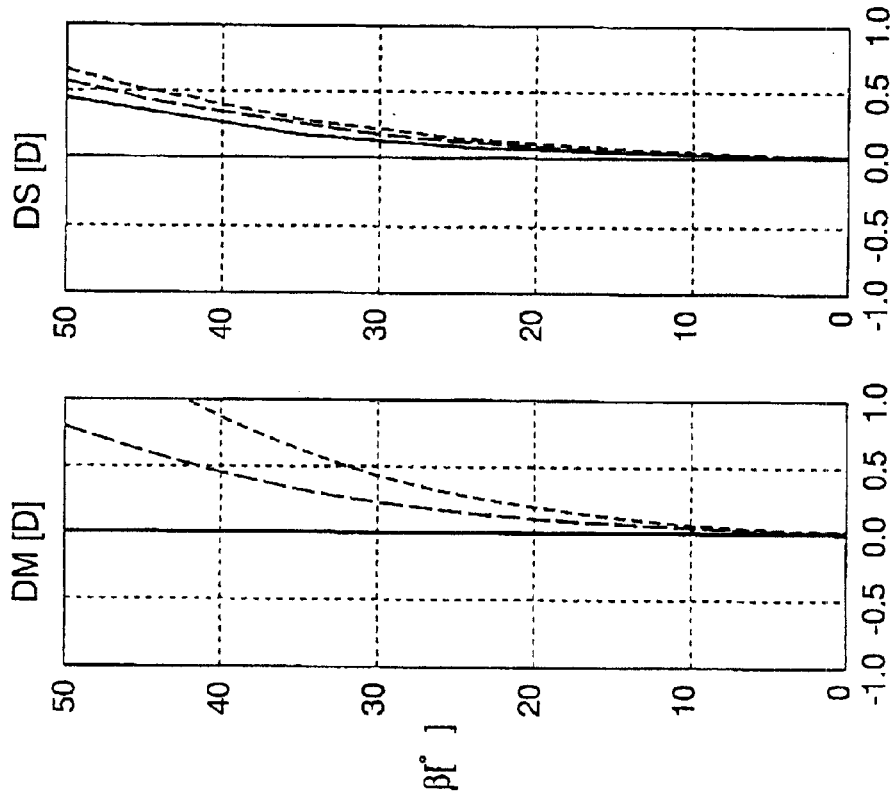
FIGS. 13A–13D are graphs showing optical aberrations of the optimized spectacle lens of the third embodiment with respect to a visual angle.
Figure 13B:
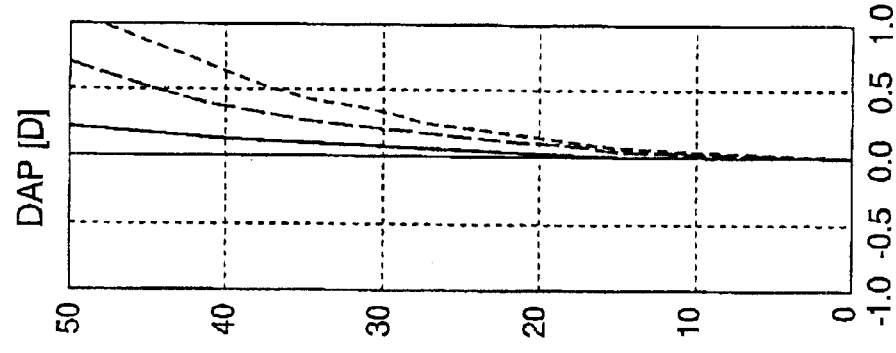
Figure 13C:
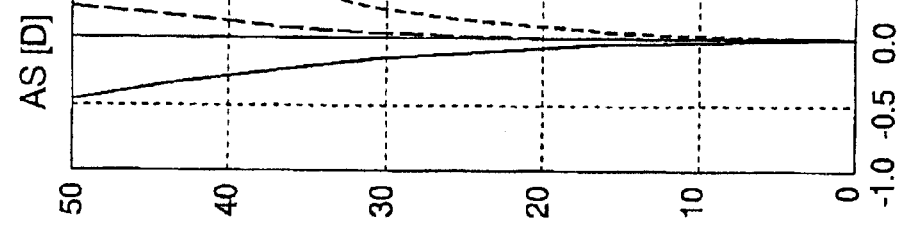
Figure 13D:
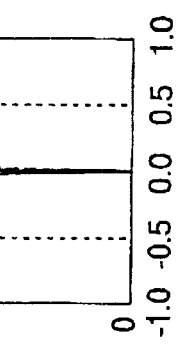
Figures 17A, 17B, 17C, 17D:
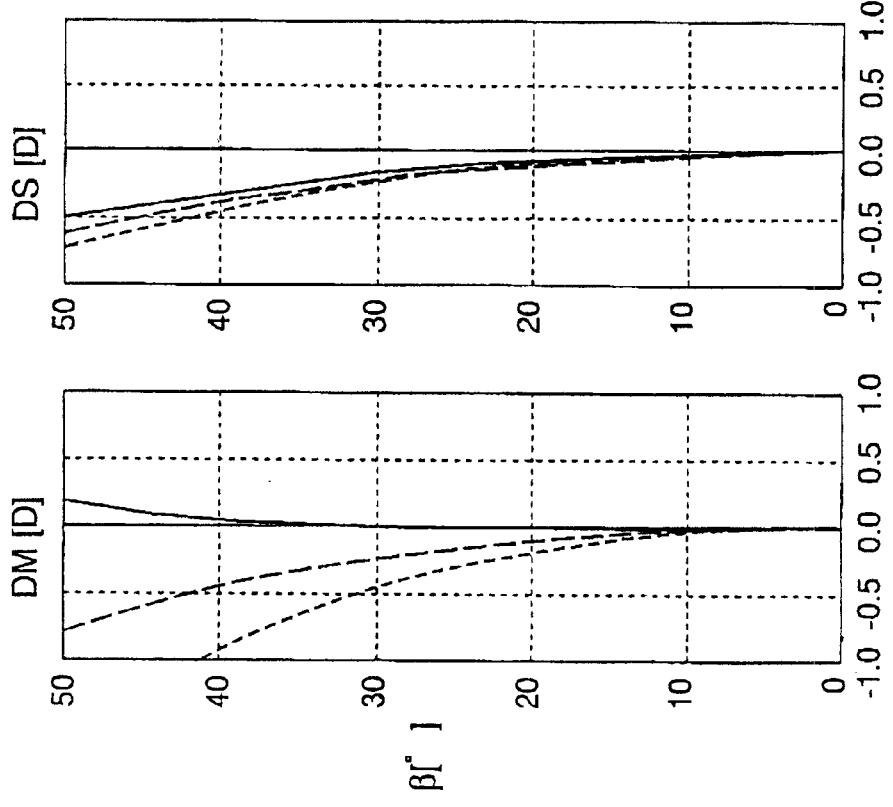
FIGS. 17A–17D are graphs showing optical aberrations of the optimized spectacle lens of the fourth embodiment with respect to a visual angle.
Figure 21:
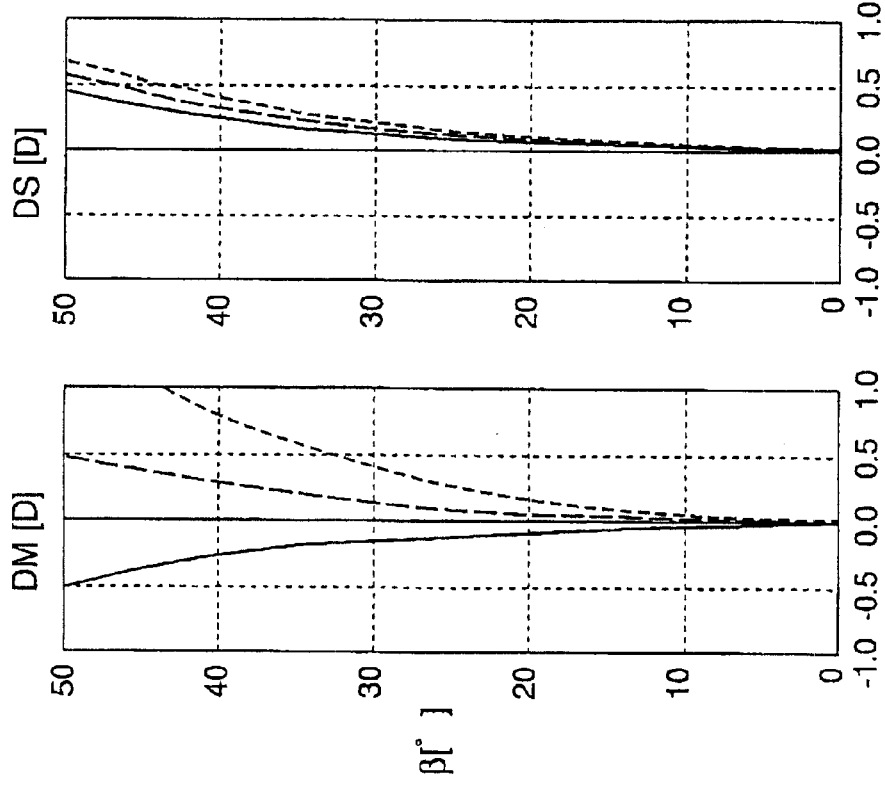
FIGS. 21A–21D are graphs showing optical aberrations of the optimized spectacle lens of the fifth embodiment with respect to a visual angle.
Figure 22:
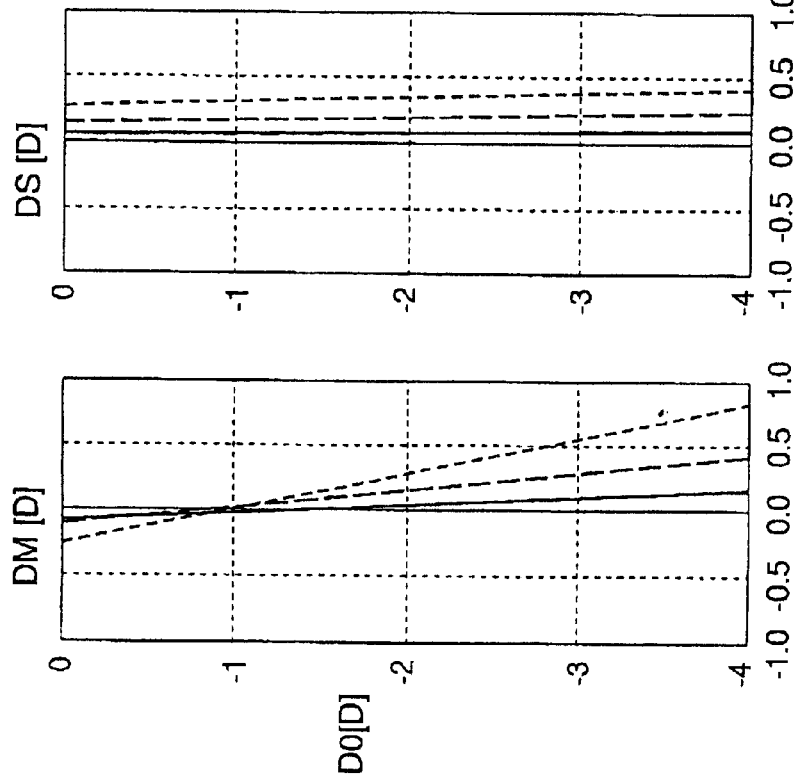
FIGS. 22A–22D are graphs showing optical aberrations of the optimized spectacle lens of the fifth embodiment with respect to an object visual diopter.
Figures 25A, 25B, 25C, 25D:
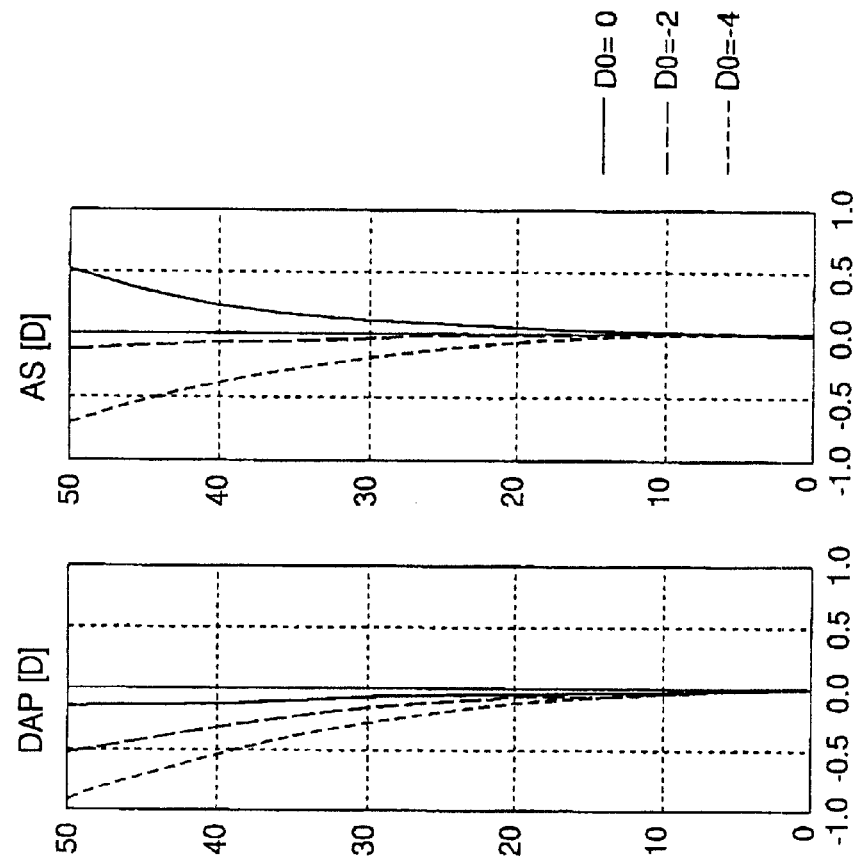
FIGS. 25A–25D are graphs showing optical aberrations of the optimized spectacle lens of the sixth embodiment with respect to a visual angle.
Figures 26A, 26B, 26C, 26D:
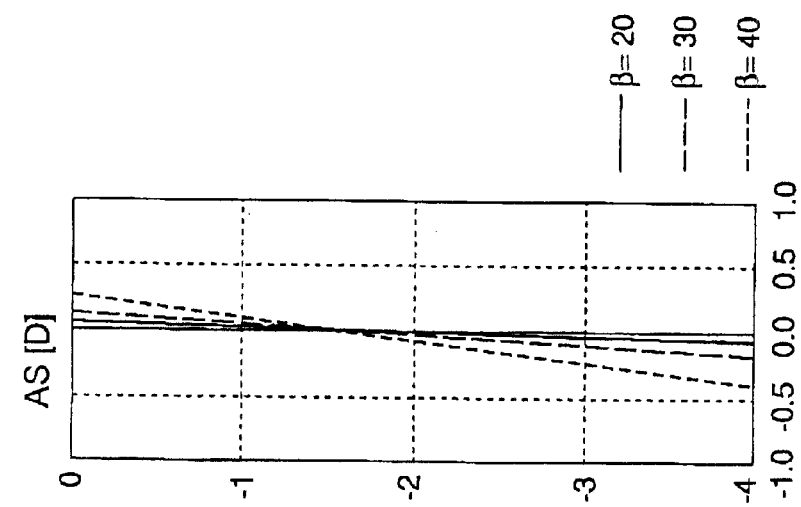
FIGS. 26A–26D are graphs showing optical aberrations of the optimized spectacle lens of the sixth embodiment with respect to an object visual diopter.
Figure 29A:
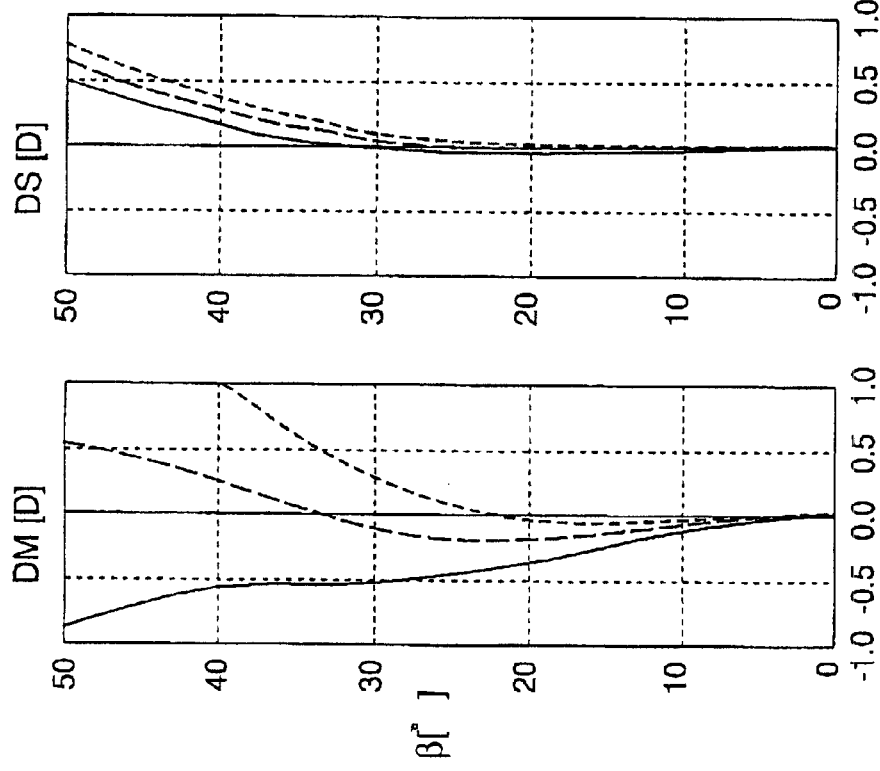
FIGS. 29A–29D are graphs showing optical aberrations of the optimized spectacle lens of the first conventional design with respect to a visual angle.
Figure 29B:
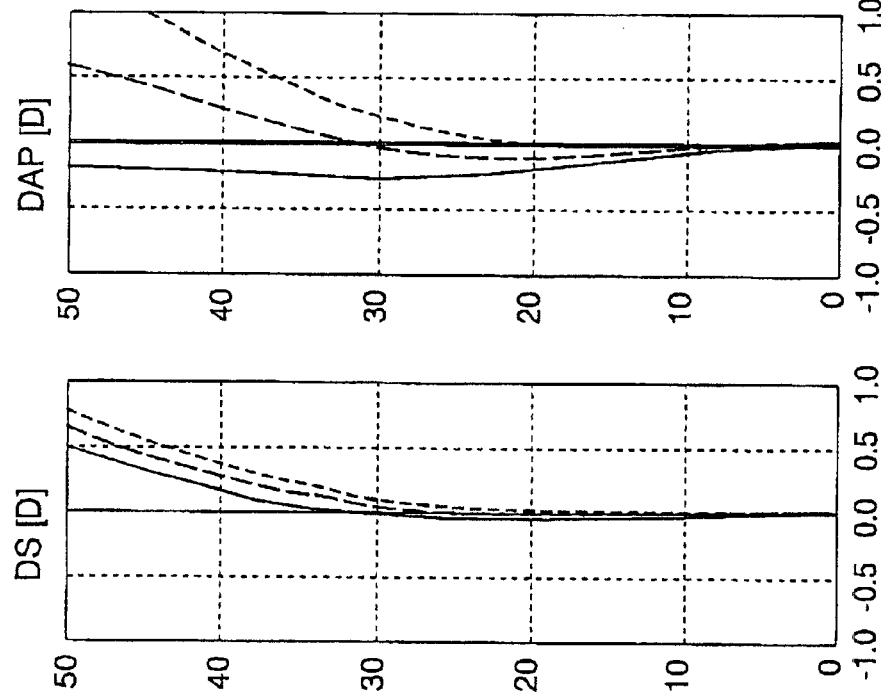
Figure 29C:
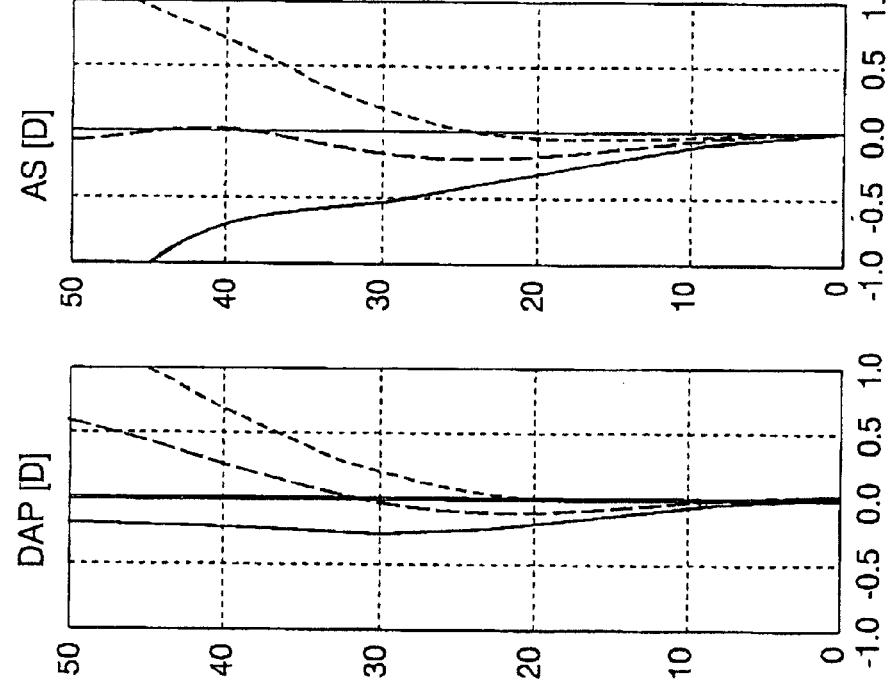
Figure 29D:
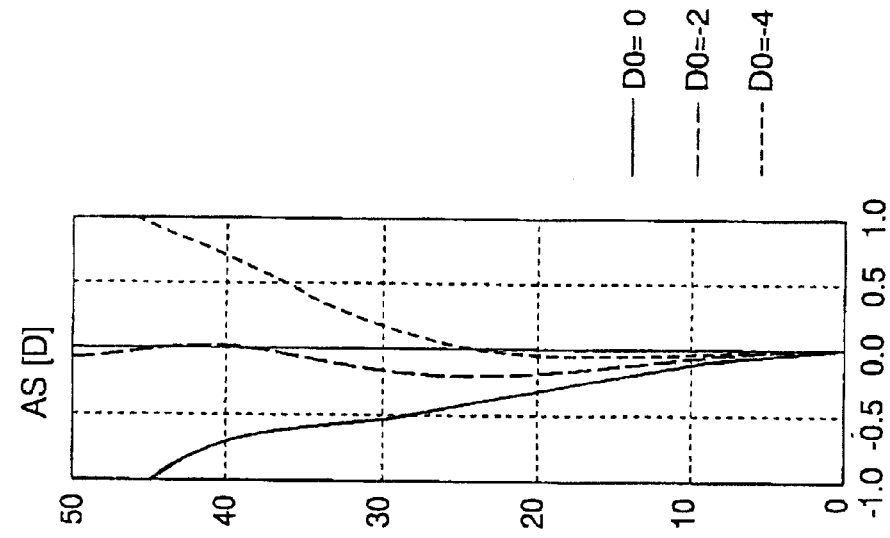

FIG. 1 is a flowchart showing the manufacturing method embodying the invention. FIG. 2 is a block diagram showing the manufacturing system to which the manufacturing method is applied.

As shown in FIG. 2, the manufacturing system is constructed of an optician's shop 10, a wide area network 20 and a lens maker 30. An ordering terminal 11 is located in the optician's shop 10. In the lens maker 30, a host computer 31, a data server 33, a manufacturing data processing computer 34 and processing machines 35, 36, . . . are installed.

The ordering terminal 11 can be connected to the host computer 31 in the lens maker 30 through the wide area network 20. Although only one optician's shop 10 is illustrated in FIG. 2, a great number of ordering terminals located in the different optician's shops can be connected to the host computer 31.

The host computer 31 is connected to a LAN 32. The data server 33 and the manufacturing data processing computer 34 installed in the lens maker 30 are also connected to the LAN 32. The processing machines 35, 36, . . . such as superfine CNC cutting machines and copy polishing machines are connected to the manufacturing data processing computer 34. The processing machines 35, 36, . . . process the spectacle lens based on NC data calculated by the manufacturing data processing computer 34.

Next, the manufacturing method employing the manufacturing system of FIG. 2 will be described with reference to FIG. 1.

When an order from a customer is received, spectacle lenses are manufactured according to steps of FIG. 1. In step S. 1, an operator input customer's ordering data (i.e., specifications of the right and left lenses) to the ordering terminal 11. The customer's data (demands) include a product type, vertex powers of right and left lenses (SPH, CYL and AXIS), an interpupillary distance, a shape of lens frame, a special specification, a lens diameter, a base curve, data of prism prescription and edging, the minimizing thickness and the shape balance between right and left lenses. Further, the customer's data includes requests for the optical performances such as a selection of a design type between an optical performance-oriented design and a cosmetic performance-oriented design, a selection of the regular (i.e., the most frequently used) object distance among far distance, middle distance and near distance. The product type determines refractive index of lens material. All of the data are not necessary to be input, while the product type and the vertex powers are essential.

In step S. 2, the ordering data inputted from the ordering terminal 11 is transmitted to the lens maker 30 through the wide area network 20. In step S. 3, the appointed date of delivery and a price of the ordered spectacle lenses are determined in the host computer 31, and the host computer transmits the ordering data and the added data by the host computer 31 to the data server 33 via the LAN 32.

In step S. 4, the manufacturing data processing computer 34 that is connected to the data server 33 via the LAN 32 selects the appropriate semifinished lens blanks based on the ordering data. In this example, semifinished lens blanks whose front surfaces are finished are stockpiled in the manufacturing factory. There are various types of semifinished lens blanks whose radii of curvatures of the front surfaces are different to one another. The shape of the front surface is selected among the predetermined shapes and the back surface is processed according to the ordering data at the later step (step S. 12). In step S. 5, the shape data of the front surfaces of the selected semifinished lenses are set.

In step S. 6, the variables are selected among the lens parameters. The refractive index N and the lens diameter DIA are fixed constants. In this example, since the back surface is aspherical, the radius of curvature R1 of the front surface and the conic coefficient κ are set as constants and the radius of curvature R2 of the back surface and the high-order aspherical surface coefficients $A_4, A_6, A_8$ and $A_{10}$ are selected as variables. The center thickness CT is set as a constant when a minus lens is designed, it should be a variable to keep an appropriate edge thickness when a plus lens is designed.

In step S. 7, the values of the same optical aberration is assigned to all of the evaluation functions except equality constraints for the optimization. The values of one of the meridional power error DM, the average power error DAP and the astigmatism AS can be selected. In this example, the average power errors DAP at the evaluation points are selected. In step S. 8, the object distance for the optimization is determined based on the ordering data. When the performance for a distance vision is considered as important, the object distance for the optimization is set as 1000 mm, for example.

In step S. 9, the vertex power AP is set as an equality constraint for the optimization. When a plus lens is designed, an edge thickness is also set as the equality constraint. In step S. 10, the variables to define the back surface are optimized by the optimizing program. Goals (i.e., target values) of the evaluation functions are set as zero. That is, the magnitude of the evaluation function (the average power error DAP) at each evaluation point is calculated and evaluated, and then the values of the variables are adjusted such that the evaluation functions are closer to zero. The processes of the calculating and adjusting are repeated until the best solution (i.e., optimum combination of the variables) is found. The process from steps S. 4 to S. 10 corresponds to the design method of a spectacle lens.

In step S. 11, the NC data is produced based on the optimized lens parameters of the back surface. The NC data may be produced in the manufacturing data processing computer 34. On the contrary, the optimized lens parameters may be transmitted from the manufacturing data processing computer 34 to the data server 33, and then the NC data may be produced in an exclusive computer for NC data production that downloads the optimized lens parameters from the data server 33.

In step S. 12, the back surface of the semifinished lens blank is surfaced by the computer controlled superfine CNC cutting machine. In step S. 13, the back surface is polished to form specular surface with the copy polishing machine. In step S. 14, the front and back surfaces are finished by applying dye and/or antireflection coating based on the ordering data. In step S. 15, the vertex power and the appearance of the finished lens are inspected. The finished lens passing the inspection is sent out to the customer in step S. 16.

Six concrete embodiments of the aspherical single-vision spectacle lens designed by the above described method will be described.

First Embodiment

FIGS. 3 to 6 show data and performance of a spectacle lens of the first embodiment. In the first embodiment, a spherical power (SPH) is −8.00 diopter, the front surface is spherical and the back surface is aspherical.

As shown in FIG. 3, the refractive index N, the lens diameter DIA, the radius of curvature R1 of the front surface, the radius of curvature R2 of the back surface, the center thickness CT, the conic coefficient κ and the high-order aspherical surface coefficients $A_4, A_6, A_8, A_{10}$ are the lens parameters. The parameters whose rightmost column "VARIABLE" are checked by marks "V" are the variables. Namely, R2 and $A_4, A_6, A_8, A_{10}$ are set as variables and the other parameters are constants. The numerical values of the variables in the column "VALUE" are the final values after optimization.

As shown in FIG. 4, the average power errors DAP at the infinite object distance at the evaluation points are assigned to the evaluation functions as the optical aberration, the vertex power AP at the lens center is added as the equality constraint. The twenty evaluation points whose distances from the optical axis are different to one another are set on the lens surface. In the table of FIG. 4, "VE" denotes the evaluation function, "OD" denotes the object distance, "h" denotes the distance of the evaluation point from the optical axis and "TV" denotes the target value. The center evaluation point is on the optical axis (the distance is 0 mm) and the distance of the farthest evaluation point is 40 mm. The interval of the evaluation points is 2 mm. The total number of the evaluation functions is 21 because one kind of the optical aberration at the twenty evaluation points and the vertex power AP are employed. The target values of the evaluation functions regarding the optical aberration (the average power error DAP) are zero. The target value of the evaluation function regarding the vertex power is set as −8.00. As shown by the values in the column "WEIGHT" of FIG. 4, the evaluated values, which are the differences between the values of the evaluation functions and the target values, are weighted such that the weight decreases with the distance from the optical axis, and the variables are optimized using the damped least squares method.

The lens of the first embodiment has the same specification as the lens designed by the first conventional design method. However, since the number of the evaluation functions of the first embodiment is about ¼ as compared with the lens of the conventional method, the cost of calculation can be extremely reduced in the first embodiment.

FIGS. 5A–5D are graphs showing the optical aberrations of the optimized spectacle lens of the first embodiment with respect to the visual angle β (unit: degrees) as the vertical axis; FIG. 5A shows the meridional power error DM, FIG. 5B shows the sagittal power error DS, FIG. 5C shows the average power error DAP and FIG. 5D shows the astigmatism AS. The solid line represents the aberration when the object visual diopter is 0 D (equivalent to the infinite object distance), the long dashed line represents the aberration when the object visual diopter is −2 D (the object distance −500 mm) and the short dashed line represents the aberration when the object visual diopter is −4 D (the object distance −250 mm).

Further, FIGS. 6A–6D are graphs showing the optical aberrations of the optimized spectacle lens of the first embodiment with respect to the object visual diopter DO (unit: D) as the vertical axis; FIG. 6A shows the meridional power error DM, FIG. 6B shows the sagittal power error, FIG. 6C shows the average power error DAP and FIG. 6D shows the astigmatism AS. The solid line represents the aberration when the visual angle is 20 degrees, the long dashed line represents the aberration when the visual angle is 30 degrees and the short dashed line represents the aberration when the visual angle is 40 degrees.

FIGS. 5A–5D show that the average power error DAP at the infinite object distance is completely corrected regardless of the change of the visual angle β and the various aberrations vary monotonously with respect to the change of the visual angle β. FIGS. 6A–6D show that the far-and-near balance of the astigmatism with respect to the object visual diopter is kept regardless of the change of the visual angle β.

Second Embodiment

FIGS. 7 to 10 show data and performance of a spectacle lens of the second embodiment. In the second embodiment, a spherical power (SPH) is +6.00 diopter, the front surface is aspherical and the back surface is spherical.

As shown in FIG. 7, the radius of curvature R2 of the back surface, the center thickness CT and the high-order aspherical surface coefficients $A_4$, $A_6$, $A_8$, $A_{10}$ are set as variables and the other parameters are constants.

As shown in FIG. 8, the average power errors DAP at the infinite object distance on the evaluation points are assigned to the evaluation functions as the optical aberration, the vertex power AP at the lens center and the edge thickness T at the point whose distance from the optical axis is 35 mm are added as the equality constraints. The total number of the evaluation functions is 22 because one kind of the optical aberration at the twenty evaluation points, the vertex power AP and the edge thickness T are employed. The target values of the evaluation functions regarding the optical aberration (the average power error DAP) are zero. The target value of the evaluation function regarding the vertex power is set as +6.00, and the target value of the edge thickness is set as 1.00. As shown by the values in the column "WEIGHT" of FIG. 8, the evaluated values are weighted such that the weight decreases with the distance from the optical axis, and the variables are optimized using the damped least squares method.

The lens of the second embodiment has the same specification as the lens designed by the second conventional design method. However, since the number of the evaluation functions of the second embodiment is about ¼ as compared with the lens of the conventional method, the cost of calculation can be extremely reduced in the second embodiment.

FIGS. 9A–9D are graphs showing the optical aberrations of the optimized spectacle lens of the second embodiment with respect to the visual angle β (unit: degrees) as the vertical axis and FIGS. 10A–10D are graphs showing the optical aberrations of the optimized spectacle lens of the second embodiment with respect to the object visual diopter DO (unit: D) as the vertical axis.

FIGS. 9A–9D show that the average power error DAP at the infinite object distance is completely corrected regardless of the change of the visual angle β and the various aberrations vary monotonously with respect to the change of the visual angle β. FIGS. 10A–10D show that the far-and-near balance of the astigmatism with respect to the object visual diopter is kept regardless of the change of the visual angle β.

Third Embodiment

FIGS. 11 to 14 show data and performance of a spectacle lens of the third embodiment. In the third embodiment, a spherical power (SPH) is −4.00 diopter, the front surface is spherical and the back surface is aspherical.

As shown in FIG. 11, the radius of curvature R2 of the back surface and the high-order aspherical surface coefficients $A_4$, $A_6$, $A_8$, $A_{10}$ are set as variables and the other parameters are constants.

As shown in FIG. 12, the average power errors DAP at the object distance 1000 mm on the evaluation points are assigned to the evaluation functions as the optical aberration, the vertex power AP at the lens center is added as the equality constraint. The total number of the evaluation functions is 21 because one kind of the optical aberration at the twenty evaluation points and the vertex power AP are employed. The target values of the evaluation functions regarding the optical aberration (the average power error DAP) are zero. The target value of the evaluation function regarding the vertex power is set as −4.00. As shown by the values in the column "WEIGHT" of FIG. 12, the evaluated values are weighted such that the weight decreases with the distance from the optical axis, and the variables are optimized using the damped least squares method.

FIGS. 13A–13D are graphs showing the optical aberrations of the optimized spectacle lens of the third embodiment with respect to the visual angle β (unit: degrees) as the vertical axis and FIGS. 14A–14D are graphs showing the optical aberrations of the optimized spectacle lens of the third embodiment with respect to the object visual diopter DO (unit: D) as the vertical axis.

These graphs show that the various aberrations vary monotonously with respect to the change of the visual angle β and the far-and-near balance of the astigmatism with respect to the object visual diopter is kept regardless of the change of the visual angle β.

Since the object visual diopter of the balance point of the astigmatism AS is −1.5 D, the lens of the third embodiment is optimized for the far object distance. When only the object distance for the optimization is changed to the finite distance from the infinite distance of the first and second embodiments, the lens performance can be optimized for the far distance or the near distance without changing the target values of the evaluation functions and the weights.

Fourth Embodiment

FIGS. 15 to 18 show data and performance of a spectacle lens of the fourth embodiment. In the fourth embodiment, a spherical power (SPH) is +4.00 diopter, the front surface is aspherical and the back surface is spherical.

As shown in FIG. 15, the radius of curvature R2 of the back surface, the center thickness CT and the high-order aspherical surface coefficients $A_4$, $A_6$, $A_8$, $A_{10}$ are set as variables and the other parameters are constants.

As shown in FIG. 16, the astigmatisms AS at the object distance −600 mm on the evaluation points are assigned to the evaluation functions as the optical aberration, the vertex power AP at the lens center and the edge thickness T at the point whose distance from the optical axis is 35 mm are added as the equality constraints. The total number of the evaluation functions is 22 because one kind of the optical aberration at the twenty evaluation points, the vertex power AP and the edge thickness T are employed. The target values of the evaluation functions regarding the optical aberration (the astigmatism AS) are zero. The target value of the evaluation function regarding the vertex power is set as +4.00, and the target value of the edge thickness is set as 1.00. As shown by the values in the column "WEIGHT" of FIG. 16, the evaluated values are weighted such that the weight decreases with the distance from the optical axis, and the variables are optimized using the damped least squares method.

FIGS. 17A–17D are graphs showing the optical aberrations of the optimized spectacle lens of the fourth embodiment with respect to the visual angle β (unit: degrees) as the vertical axis and FIGS. 18A–18D are graphs showing the optical aberrations of the optimized spectacle lens of the fourth embodiment with respect to the object visual diopter DO (unit: D) as the vertical axis.

These graphs show that the various aberrations vary monotonously with respect to the change of the visual angle β and the far-and-near balance of the astigmatism with respect to the object visual diopter is kept regardless of the change of the visual angle β. The object visual diopter of the balance point of the astigmatism AS is −1.67 D.

Fifth Embodiment

FIGS. 19 to 22 show data and performance of a spectacle lens of the fifth embodiment. In the fifth embodiment, a spherical power (SPH) is −5.00 diopter, the front surface is aspherical and the back surface is spherical.

As shown in FIG. 19, the radius of curvature R2 of the back surface and the high-order aspherical surface coefficients $A_4$, $A_6$, $A_8$, $A_{10}$ are set as variables and the other parameters are constants.

As shown in FIG. 20, the meridional power errors DM at the object distance −1000 mm on the evaluation points are assigned to the evaluation functions as the optical aberration, the vertex power AP at the lens center is added as the equality constraint, The total number of the evaluation functions is 21 because one kind of the optical aberration at the twenty evaluation points and the vertex power AP are employed. The target values of the evaluation functions regarding the optical aberration (the meridional power error DM) are zero. The target value of the evaluation function regarding the vertex power is set as −4.00. As shown by the values in the column "WEIGHT" of FIG. 20, the evaluated values are weighted such that the weight decreases with the distance from the optical axis, and the variables are optimized using the damped least squares method.

FIGS. 21A–21D are graphs showing the optical aberrations of the optimized spectacle lens of the fifth embodiment with respect to the visual angle β (unit: degrees) as the vertical axis and FIGS. 22A–22D are graphs showing the optical aberrations of the optimized spectacle lens of the fifth embodiment with respect to the object visual diopter DO (unit: D) as the vertical axis.

These graphs show that the various aberrations vary monotonously with respect to the change of the visual angle β and the far-and-near balance of the astigmatism with respect to the object visual diopter is kept regardless of the change of the visual angle β. The object visual diopter of the balance point of the astigmatism AS is −2.0 D.

Since the optical aberrations DM, DS, DAP and AS are closely related to one another, the balance of the optimized lens of the fifth embodiment whose evaluation functions are the astigmatisms AS is similar to that of the first embodiment whose evaluation functions are the average power errors DAP.

Sixth Embodiment

FIGS. 23 to 26 show data and performance of a spectacle lens of the sixth embodiment. In the sixth embodiment, a spherical power (SPH) is +3.00 diopter, the front surface is spherical and the back surface is aspherical.

As shown in FIG. 23, the radius of curvature R2 of the back surface, the center thickness CT and the high-order aspherical surface coefficients $A_4$, $A_6$, $A_8$, $A_{10}$ are set as variables and the other parameters are constants.

As shown in FIG. 24, the average astigmatisms ASavg at the evaluation points are assigned to the evaluation functions as the optical aberration, the vertex power AP at the lens center and the edge thickness T at the point whose distance from the optical axis is 35 mm are added as the equality constraints. The average astigmatism ASavg is an average of the astigmatism AS at the infinite object distance and the astigmatism at the object distance −300 mm. The total number of the evaluation functions is 22 because one kind of the optical aberration at the twenty evaluation points, the vertex power AP and the edge thickness T are employed. The target values of the evaluation functions regarding the optical aberration (the averaged astigmatism ASavg) are zero. The target value of the evaluation function regarding the vertex power is set as +3.00, and the target value of the edge thickness is set as 1.00. As shown by the values in the column "WEIGHT" of FIG. 24, the evaluated values are weighted such that the weight decreases with the distance from the optical axis, and the variables are optimized using the damped least squares method.

FIGS. 25A–25D are graphs showing the optical aberrations of the optimized spectacle lens of the sixth embodiment with respect to the visual angle β (unit: degrees) as the vertical axis and FIGS. 26A–26D are graphs showing the optical aberrations of the optimized spectacle lens of the sixth embodiment with respect to the object visual diopter DO (unit: D) as the vertical axis.

These graphs show that the various aberrations vary monotonously with respect to the change of the visual angle β and the far-and-near balance of the astigmatism with respect to the object visual diopter is kept regardless of the change of the visual angle β. The object visual diopter of the balance point of the astigmatism AS is −1.67 D that is middle point between the infinity (0 D) and −300 mm (−3.33 D).

In the sixth embodiment, since two astigmatisms should be calculated at each evaluation point to find the average astigmatism ASavg, the cost of calculation becomes larger than the other embodiments. The sixth embodiment suggests that a new aberration, which is a combination of the meridional power error DM, the sagittal power error DS, the average power error DAP and the astigmatism AS, can be employed as the evaluation function to obtain the similar optimizing result.

As described above, according to the design method of a aspherical single-vision spectacle lens, the cost of calculation can be reduced by decreasing the number of the evaluation functions, and it is possible to take all of the final values of the evaluation functions regarding the optical aberration as zero. Therefore, it is unnecessary that an operator intervenes to control the weighting and to monitor the condition of the optimization, which reduces the labor cost and keeps the design repeatability. Further, since the values of only one optical aberration can be employed as the evaluation functions, the variation of the far-and-near balance depending on the change of the visual angle can be reduced.

The present disclosure relates to the subject matter contained in Japanese Patent Application No. 2000-137108, filed on May 10, 2000 which are expressly incorporated herein by reference in its entirety.

What is claimed is:

1. A method for designing a rotationally symmetrical single-vision spectacle lens whose at least one of front and back surfaces is an aspherical surface, said method comprising:

selecting one or more lens parameters as variables among a plurality of lens parameters;

assigning values of the same optical aberration at different evaluation points on said lens to all of evaluation functions that evaluate optical aberration;

optimizing said selected lens parameters by setting target values of said evaluation functions that evaluate optical aberration to zero, wherein said optimizing comprises repetition of calculating the magnitudes of said evaluation functions; and adjusting the values of said selected lens parameters such that said evaluation functions are closer to zero.

2. The designing method according to claim 1, wherein said optical aberration assigned to said evaluation functions is one of meridional power error, sagittal power error and aberration defined as weighted sum of the meridional and sagittal power errors.

3. The designing method according to claim 2, wherein said optical aberration assigned to said evaluation functions is average power error calculated by 0.5×DM+0.5×DS, where DM is said meridional power error and DS is said sagittal power error.

4. The designing method according to claim 2, wherein said optical aberration assigned to said evaluation functions is astigmatism calculated by DM+(−1)×DS, where DM is said meridional power error and DS is said sagittal power error.

5. The designing method according to claim 1, wherein each of said evaluation functions delivers the magnitude of said optical aberration at a predetermined object distance.

6. The designing method according to claim 1, wherein each of said evaluation functions delivers the calculation result of the magnitudes of said optical aberration at a plurality of predetermined object distances.

7. The designing method according to claim 6, wherein said evaluation function delivers the average of values of said astigmatism at two different object distances.

8. The designing method according to claim 1, wherein said optimizing employs either a least squares method or a damped least squares method as an optimizing algorithm.

9. The designing method according to claim 1, wherein said optimizing employs either a least squares method or a damped least squares method with equality constraints as an optimizing algorithm.

10. The designing method according to claim 9, wherein said equality constraints includes at least one of the minimum lens thickness, or vertex power.

11. A method for manufacturing a rotationally symmetrical single-vision spectacle lens whose at least one of front and back surfaces is an aspherical surface, said method comprising:

selecting one or more lens parameters as variables among a plurality of lens parameters;

assigning values of the same optical aberration at different evaluation points on said lens to all of evaluation functions that evaluate optical aberration;

optimizing said selected lens parameters by setting target values of said evaluation functions to zero based on ordering data;

calculating manufacturing data from the optimized lens parameters; and processing a refractive surface of said lens according to said manufacturing data, wherein said optimizing comprises repetition of calculating the magnitude of said evaluation function at each evaluation point on said lens; and adjusting the values of said selected lens parameters such that said evaluation functions are closer to zero.

12. A system for manufacturing a rotationally symmetrical single-vision spectacle lens whose at least one of front and back surfaces is an aspherical surface, said system comprising:

an input device that is used for inputting ordering data that defines a specification of a spectacle lens;

a calculating device that calculates an optimum lens shape from said ordering data; and a processing device that processes said lens based on said optimum lens shape, wherein said calculating device selects one or more lens parameters as variables among a plurality of lens parameters and assigns values of the same optical aberration at different evaluation points on said lens to all of evaluation functions that evaluate optical aberration, and said calculating device optimizes said selected lens parameters by evaluating said evaluation functions.

* * * * *